(12) United States Patent
Seo et al.

(10) Patent No.: US 12,219,801 B2
(45) Date of Patent: *Feb. 4, 2025

(54) DISPLAY PANEL AND A METHOD OF FABRICATING THE SAME

(71) Applicant: Samsung Display Co., Ltd., Yongin-Si (KR)

(72) Inventors: Junghan Seo, Seoul (KR); Hyoungsub Lee, Yongin-si (KR); Wooyong Sung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/197,152

(22) Filed: May 15, 2023

(65) Prior Publication Data

US 2023/0284476 A1    Sep. 7, 2023

Related U.S. Application Data

(63) Continuation of application No. 17/583,493, filed on Jan. 25, 2022, now Pat. No. 11,653,525, which is a
(Continued)

(30) Foreign Application Priority Data

Apr. 30, 2018    (KR) .................. 10-2018-0049886

(51) Int. Cl.
  *G06F 3/044*    (2006.01)
  *G06F 3/041*    (2006.01)
  (Continued)

(52) U.S. Cl.
  CPC ......... *H10K 50/844* (2023.02); *G06F 3/0412* (2013.01); *G06F 3/0444* (2019.05);
  (Continued)

(58) Field of Classification Search
  CPC ...... H10K 50/844; H10K 59/40; H10K 71/00; H10K 50/8426; H10K 59/121;
  (Continued)

(56) References Cited

U.S. PATENT DOCUMENTS 5,936,914 A    8/1999 Yamaguchi et al.
9,634,074 B2    4/2017 Son et al.
(Continued)

FOREIGN PATENT DOCUMENTS

CN    107579171    1/2018
EP    3206231    8/2017
(Continued)

OTHER PUBLICATIONS

European Search Report issued in corresponding European Patent Application No. 19171454.2 dated Sep. 27, 2019.

*Primary Examiner* — Md Saiful A Siddiqui
(74) *Attorney, Agent, or Firm* — F. CHAU & ASSOCIATES, LLC

(57) ABSTRACT

A display panel including: a base substrate including first and second surfaces, a display region and a peripheral region; a pixel layer provided on the display region, the pixel layer including a plurality of pixels; a module hole penetrating the display region; a blocking groove in the display region and adjacent to the module hole, the blocking groove being recessed in the base substrate; an encapsulation layer provided on the pixel layer, the encapsulation layer including a first inorganic layer, a second inorganic layer and an organic layer; and a filling member in the blocking groove, the filling member including a same material as the organic layer, wherein the second inorganic layer covers a top surface of the filling member and a top surface of the first inorganic layer adjacent to the top surface of the filling member.

30 Claims, 30 Drawing Sheets

Related U.S. Application Data continuation of application No. 16/385,659, filed on Apr. 16, 2019, now Pat. No. 11,233,220.

(51) Int. Cl.
  *H10K 50/844* (2023.01)
  *H10K 59/40* (2023.01)
  *H10K 71/00* (2023.01)

(52) U.S. Cl.
  CPC ........... *G06F 3/0445* (2019.05); *H10K 59/40* (2023.02); *H10K 71/00* (2023.02)

(58) Field of Classification Search
  CPC .... H10K 59/12; H10K 59/1201; H10K 59/87; G06F 3/0412; G06F 3/0444; G06F 3/0445
  See application file for complete search history.

(56) References Cited

U.S. PATENT DOCUMENTS

| | | | |
|---|---|---|---|
| 9,825,103 | B2 | 11/2017 | Rappoport et al. |
| 10,054,361 | B2 | 8/2018 | Kim et al. |
| 10,128,461 | B2 | 11/2018 | Kang et al. |
| 10,135,010 | B2 | 11/2018 | Kim et al. |
| 10,153,329 | B2 | 12/2018 | Kao et al. |
| 10,230,069 | B2 | 3/2019 | Choi et al. |
| 10,276,644 | B2 | 4/2019 | You et al. |
| 10,319,938 | B2 | 6/2019 | Choi et al. |
| 10,347,853 | B2 | 7/2019 | Park et al. |
| 10,644,087 | B2 | 5/2020 | Lee et al. |
| 10,727,450 | B2 | 7/2020 | Yun et al. |
| 10,872,932 | B2 | 12/2020 | Shi et al. |
| 11,223,027 | B2 | 1/2022 | Park et al. |
| 11,233,220 | B2 | 1/2022 | Seo et al. |
| 2007/0194449 | A1 | 8/2007 | Hirai |
| 2009/0115066 | A1 | 5/2009 | Yang et al. |
| 2014/0133282 | A1* | 5/2014 | Hamm ............... H10K 50/8428 438/26 |
| 2015/0325719 | A1 | 11/2015 | Wijdekop et al. |
| 2016/0190389 | A1* | 6/2016 | Lee .......................... A61B 5/316 438/28 |
| 2016/0233248 | A1 | 8/2016 | Kwak et al. |
| 2017/0026553 | A1 | 1/2017 | Lee et al. |
| 2017/0031323 | A1* | 2/2017 | Kim ..................... H10K 59/124 |
| 2017/0047544 | A1* | 2/2017 | Kang .................. H10K 50/844 |
| 2017/0148856 | A1 | 5/2017 | Choi et al. |
| 2017/0170247 | A1 | 6/2017 | Kim |
| 2017/0288004 | A1* | 10/2017 | Kim ..................... H10K 59/124 |
| 2017/0372123 | A1 | 12/2017 | Kim et al. |
| 2019/0244766 | A1 | 8/2019 | Matsuo et al. |
| 2019/0334117 | A1 | 10/2019 | Hong et al. |
| 2019/0334120 | A1 | 10/2019 | Seo et al. |
| 2020/0020752 | A1* | 1/2020 | Shi ........................ H10K 59/12 |
| 2022/0149328 | A1 | 5/2022 | Seo et al. |

FOREIGN PATENT DOCUMENTS

| | | |
|---|---|---|
| EP | 3276460 | 1/2018 |
| KR | 10-0623338 | 9/2006 |
| KR | 10-2015-0071642 | 6/2015 |
| KR | 10-2016-0096760 | 8/2016 |
| KR | 10-2017-0019553 | 2/2017 |
| KR | 10-2017-0045459 | 4/2017 |
| KR | 10-2017-0059864 | 5/2017 |
| KR | 10-2017-0115177 | 10/2017 |
| KR | 10-2018-0009845 | 1/2018 |

* cited by examiner

FIG. 6C
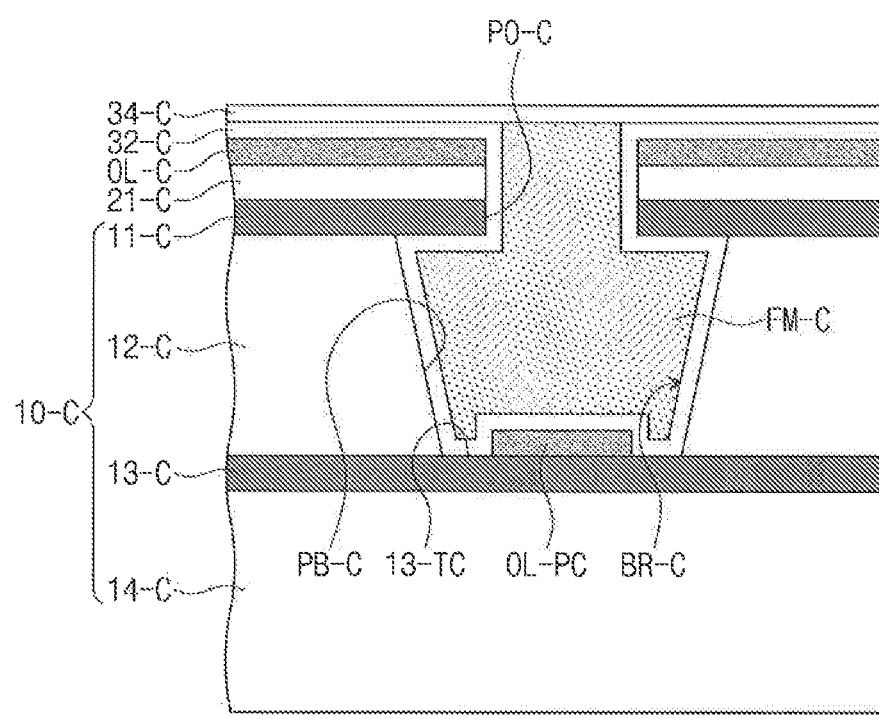
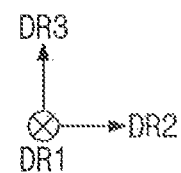

FIG. 6D
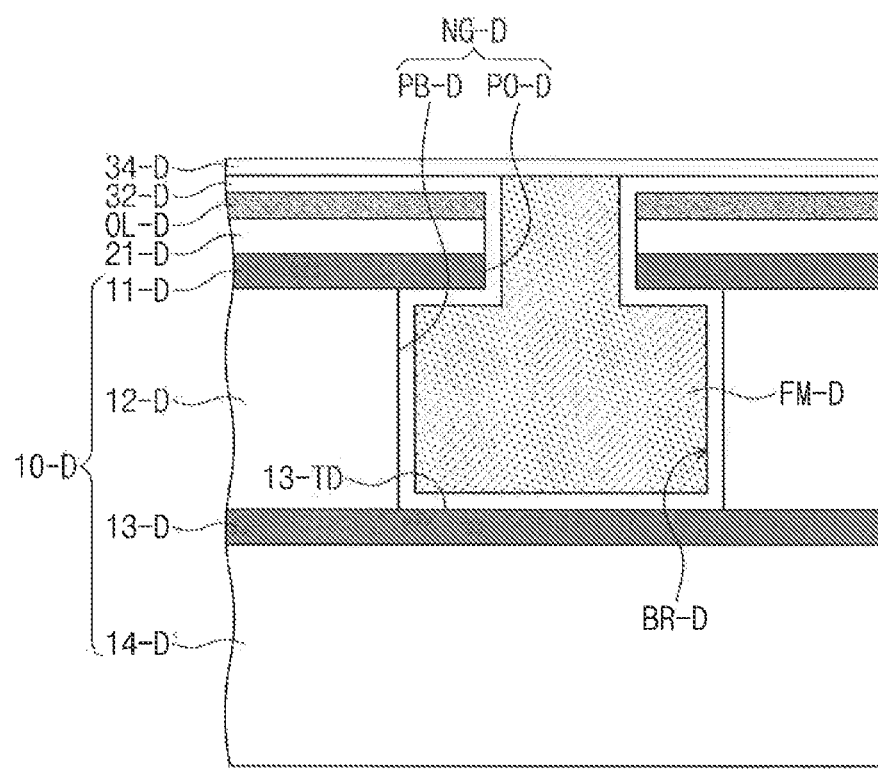
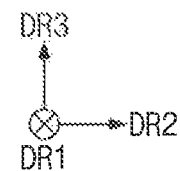

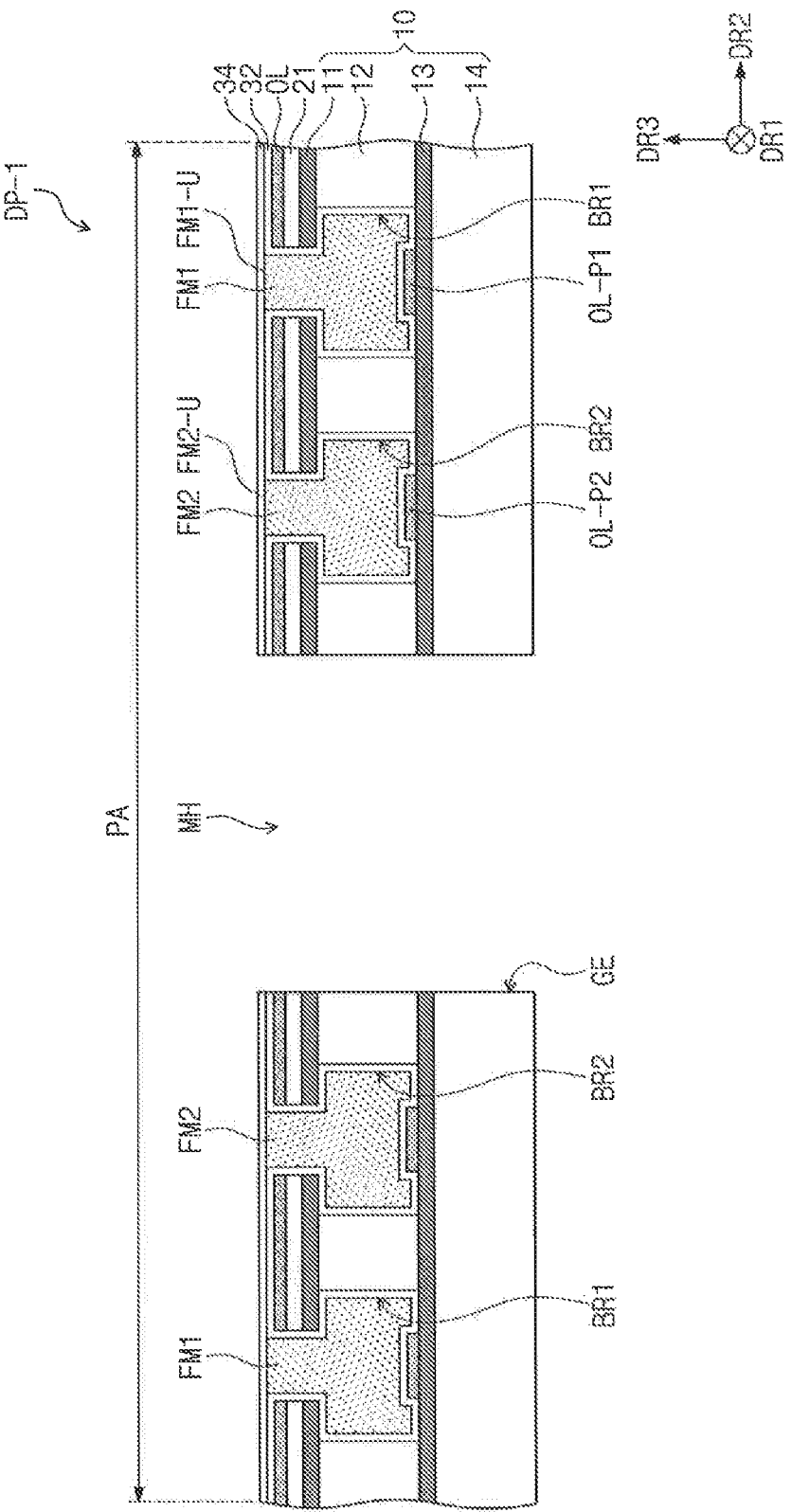

DISPLAY PANEL AND A METHOD OF FABRICATING THE SAME

CROSS-REFERENCE TO RELATED APPLICATIONS

This U.S. non-provisional is a continuation of U.S. patent application Ser. No. 17/583,493 filed on Jan. 25, 2022, which is a continuation of U.S. patent application Ser. No. 16/385,659 filed on Apr. 16, 2019, now. U.S. Pat. No. 11,233,220 issued on Jan. 25, 2022, which claims priority under 35 U.S.C. § 119 to Korean Patent Application No. 10-2018-0049886, filed on Apr. 30, 2018, in the Korean Intellectual Property Office, the disclosures of which are incorporated by reference herein in their entireties.

TECHNICAL FIELD

The present inventive concept relates to a display panel and a method of fabricating the same, and in particular, to a highly reliable display panel and a method of fabricating the same.

DISCUSSION OF RELATED ART

A display panel is an electronic device used to display an image. An organic light emitting display panel is an example of a display panel and has certain characteristics, such as low power consumption, high brightness, and high response speed.

The organic light emitting display panel includes an organic light emitting device, which may be damaged by oxygen or moisture. If the organic light emitting display panel is configured to effectively block the oxygen or moisture, the reliability and lifespan of the organic light emitting display panel can be increased.

SUMMARY

According to an exemplary embodiment of the inventive concept, a display panel may include a base substrate including a first surface and a second surface and including a display region and a peripheral region, which are adjacent to each other when viewed in a plan view, a pixel layer including a plurality of pixels provided on the display region, a module hole penetrating the display region of the base substrate from the first surface to the second surface, a blocking groove provided in the display region of the base substrate and adjacent to the module hole, the blocking groove being recessed in the base substrate, an encapsulation layer provided on the pixel layer, the encapsulation layer including a first inorganic layer, a second inorganic layer on the first inorganic layer, and an organic layer between the first inorganic layer and the second inorganic layer, and a filling member provided in the blocking groove, the filling member including a same material as the organic layer. The second inorganic layer may cover a top surface of the filling member and a top surface of the first inorganic layer adjacent to the top surface of the filling member.

In an exemplary embodiment of the inventive concept, the base substrate may include a first base layer and a first barrier layer. The first base layer may include an organic material and may include a first patterned portion, which is recessed beneath a top surface of the first base layer. The first barrier layer may be provided on the top surface of the first base layer to define the first surface of base substrate. The first barrier layer may include an inorganic material and may include a first opening, which is connected to the first patterned portion to define an internal space. The blocking groove may be provided in the internal space, and the first inorganic layer may cover the internal space and define an inner surface of the blocking groove.

In an exemplary embodiment of the inventive concept, a width of the first opening may be smaller than a width of the first patterned portion.

In an exemplary embodiment of the inventive concept, the base substrate may further include a second base layer provided below the first base layer and defining the second surface of the base substrate, a second barrier layer provided between the second base layer and the first base layer. The second base layer may contain an organic material, and the second barrier layer may contain an inorganic material. The first patterned portion may penetrate the first base layer and expose a portion of the second barrier layer.

In an exemplary embodiment of the inventive concept, the base substrate may further include a second patterned portion overlapped with the first opening, when viewed in a plan view, and a second opening provided in the second barrier layer. The second patterned portion may be recessed beneath a top surface of the second base layer, and the second opening may be connected to the second patterned portion to define a space within the second base layer. The second opening and the second patterned portion may be covered with the first inorganic layer.

In an exemplary embodiment of the inventive concept, the display panel may further include a charge control layer provided between the first barrier layer and the first inorganic layer. The charge control layer may include a first end portion adjacent to the blocking groove and a second end portion adjacent to the module hole. The first end portion may be covered with the first inorganic layer, and the second end portion may be exposed to define an inner surface of the module hole.

In an exemplary embodiment of the inventive concept, the display panel may further include a partition wall member provided on the base substrate and adjacent to the organic layer. The first inorganic layer and the second inorganic layer may cover the partition wall member. In an exemplary embodiment of the inventive concept, the blocking groove may include first and second blocking grooves, when viewed in a plan view. The first and second blocking grooves may be spaced apart from each other, in a region overlapped by the organic layer and adjacent to the module hole when viewed in a plan view, the partition wall member is provided on regions between the first and second blocking groove sand the organic layer, between the blocking grooves and the module hole, and between the blocking grooves.

According to an exemplary embodiment of the inventive concept, an electronic device may include a base substrate including a first base layer containing an organic material and a first barrier layer containing an inorganic material and covering a top surface of the first base layer, the base substrate including a display region and a peripheral region, which are adjacent to each other when viewed in a plan view, a pixel layer including a plurality of pixels provided on the display region, an encapsulation layer including a first inorganic layer on the pixel layer, a second inorganic layer on the first inorganic layer, and an organic layer between the first and second inorganic layers, a module hole penetrating the display region of the base substrate, a blocking groove provided in the display region of the base substrate and covered by the first inorganic layer, a filling member including a same material as the organic layer and filling the blocking groove, and an electronic module overlapped with the module hole. The blocking groove may include an opening, which penetrates the first barrier layer, and a patterned portion, which is overlapped with the opening when viewed in a plan view and is recessed below the top surface of the first base layer.

In an exemplary embodiment of the inventive concept, the second inorganic layer may be in contact with a top surface of the filling member exposed by the opening and a top surface of the first inorganic layer adjacent to the top surface of the filling member.

In an exemplary embodiment of the inventive concept, the blocking groove may have a closed curve shape enclosing the module hole, when viewed in a plan view.

In an exemplary embodiment of the inventive concept, when viewed in a plan view, a shape of the module hole may be different from the closed curve shape of the blocking groove.

In an exemplary embodiment of the inventive concept, the electronic device may further include a touch sensor, which is provided on the encapsulation layer, and a third inorganic layer, which covers the touch sensor. The third inorganic layer may cover the second inorganic layer.

In an exemplary embodiment of the inventive concept, the first barrier layer includes first and second tip portions overlapping the blocking groove, the first and second tip portions may be in contact with the filling member and may be supported by the filling member.

In an exemplary embodiment of the inventive concept, a width of the filling member between the first and second tip portions is less than a width of the filling member between the first base layer in the blocking groove.

According to an exemplary embodiment of the inventive concept, a method of fabricating a display panel may include forming a pixel layer including a plurality of pixels on a display region of a base substrate, wherein the base substrate includes a peripheral region adjacent to the display region, the display region including a hole region and a blocking region enclosing the hole region, when viewed in a plan view, removing a portion of the base substrate overlapped with the blocking region to form a blocking groove, depositing a first inorganic layer on the base substrate to cover the pixel layer and an inner surface of the blocking groove, depositing an organic material on the first inorganic layer to form a preliminary organic layer filling the blocking groove and covering the pixel layer, removing the preliminary organic layer from a portion of each of the display and blocking regions to form an organic layer and a filling member, forming a second inorganic layer to cover the organic layer and the filling member, and forming a module hole to penetrate a portion of the base substrate enclosed by the blocking groove.

In an exemplary embodiment of the inventive concept, the module hole may be formed to penetrate the base substrate, the first inorganic layer, and the second inorganic layer and to have a side surface defined by an exposed end of each of the base substrate, the first inorganic layer, and the second inorganic layer.

In an exemplary embodiment of the inventive concept, the forming of the pixel layer may include forming an organic light emitting layer and a common layer. A portion of an organic material constituting the common layer may be used as an organic pattern covering a portion of the blocking groove, and the first inorganic layer may be formed to cover the organic pattern.

In an exemplary embodiment of the inventive concept, the method may further include forming a partition wall member between the pixel layer and the blocking groove. The forming of the pixel layer may include forming a thin-film device layer between a plurality of insulating layers and forming a display device layer coupled to the thin-film device layer. The partition wall member may be formed by a same process as that used to form the plurality of insulating layers.

In an exemplary embodiment of the inventive concept, the preliminary organic layer may include a first preliminary organic layer provided on the pixel layer and a second preliminary organic layer provided on the blocking groove. The forming of the organic layer and the filling member may include removing a portion of the second preliminary organic layer to expose the first inorganic layer on the blocking region.

BRIEF DESCRIPTION OF THE DRAWINGS

Exemplary embodiments of the inventive concept will be more clearly understood from the following detailed description taken in conjunction with the accompanying drawings.

FIGS. 6A, 6B, 6C, 6D and 6E are sectional views each illustrating a portion of a display panel according to an exemplary embodiment of the inventive concept.

FIG. 7 is a sectional view illustrating a portion of a display panel according to an exemplary embodiment of the inventive concept.

DETAILED DESCRIPTION OF THE EMBODIMENTS

Figure 1:
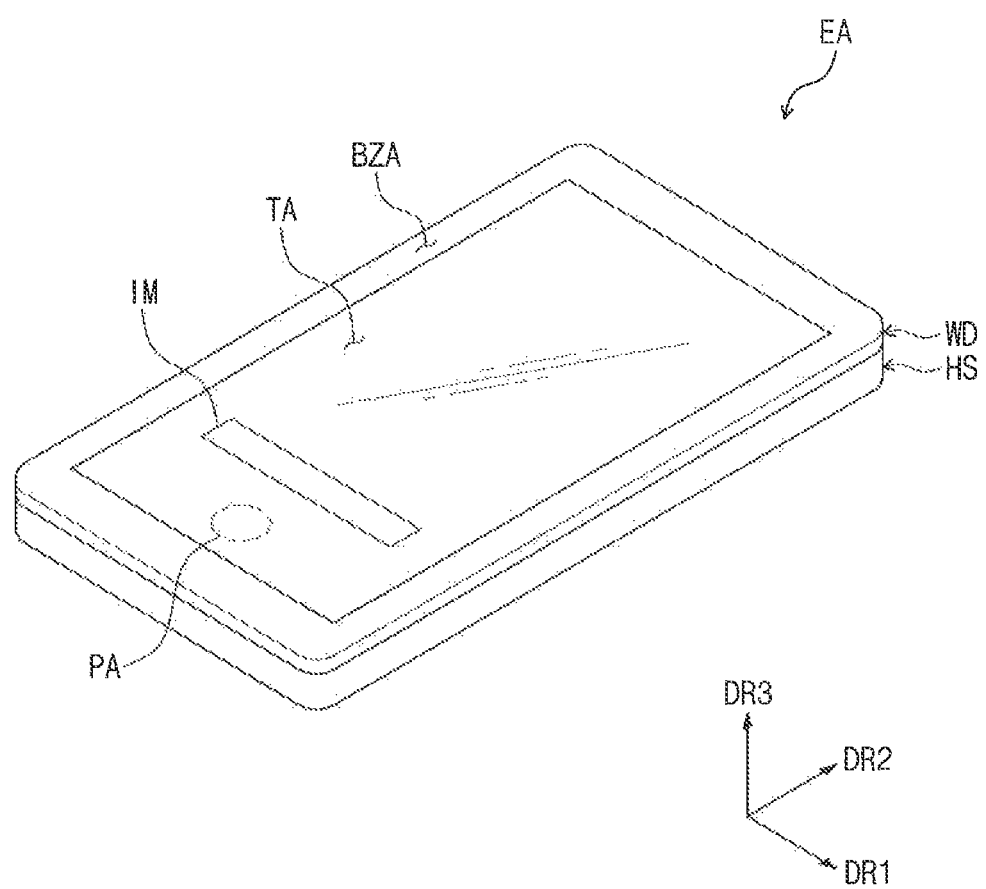
FIG. 1 is a perspective view illustrating an electronic display device according to an exemplary embodiment of the inventive concept.

Exemplary embodiments of the inventive concept will now be described more fully with reference to the accompanying drawings. Exemplary embodiments of the inventive concept may, however, be embodied in many different forms and should not be construed as being limited to the embodiments set forth herein. In the drawings, the thicknesses of layers and regions may be exaggerated for clarity. Like reference numerals in the drawings may denote like elements, and thus, their description may be omitted.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

Figure 2:
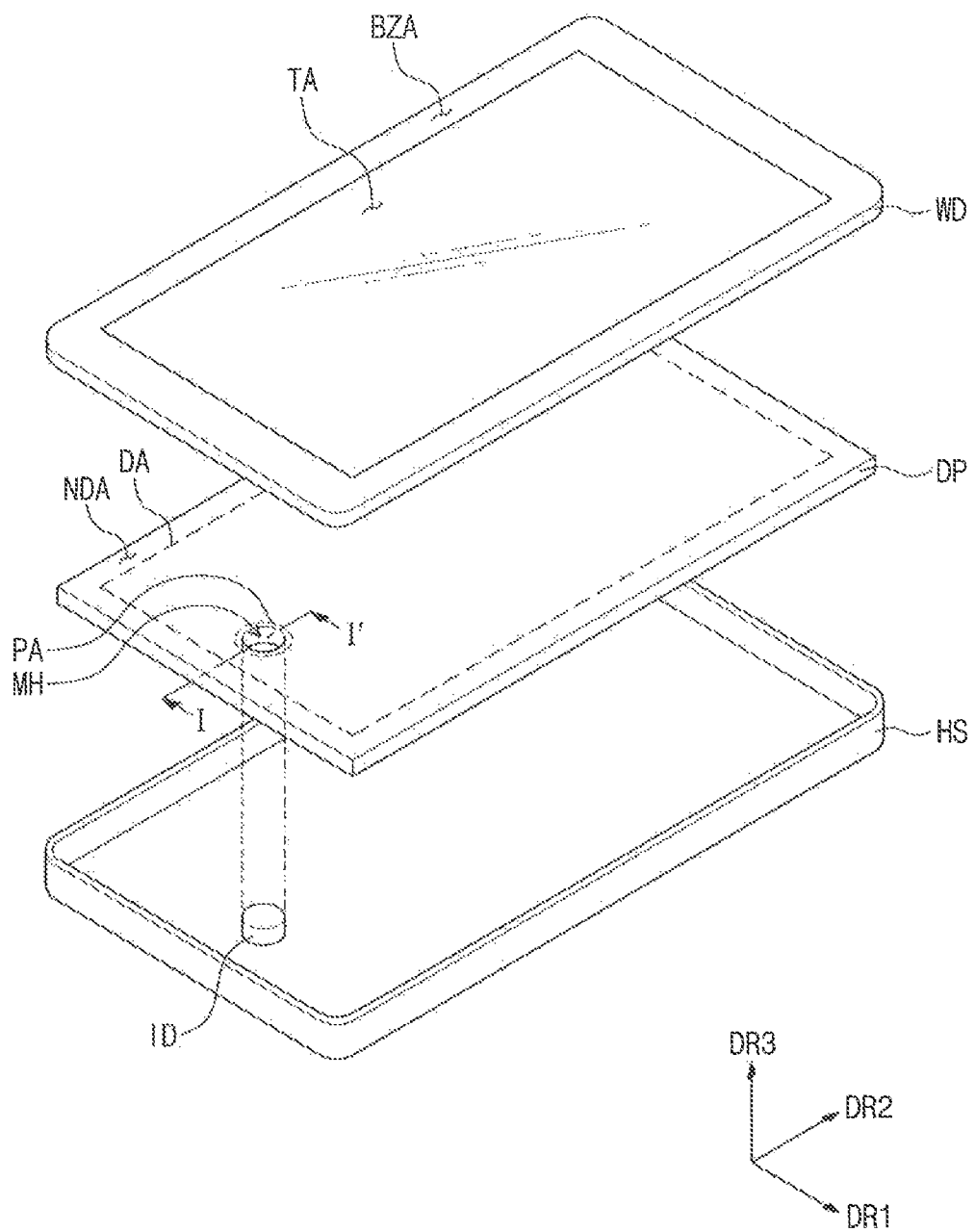
FIG. 2 is an exploded perspective view of the electronic device of FIG. 1.
Figure 3:
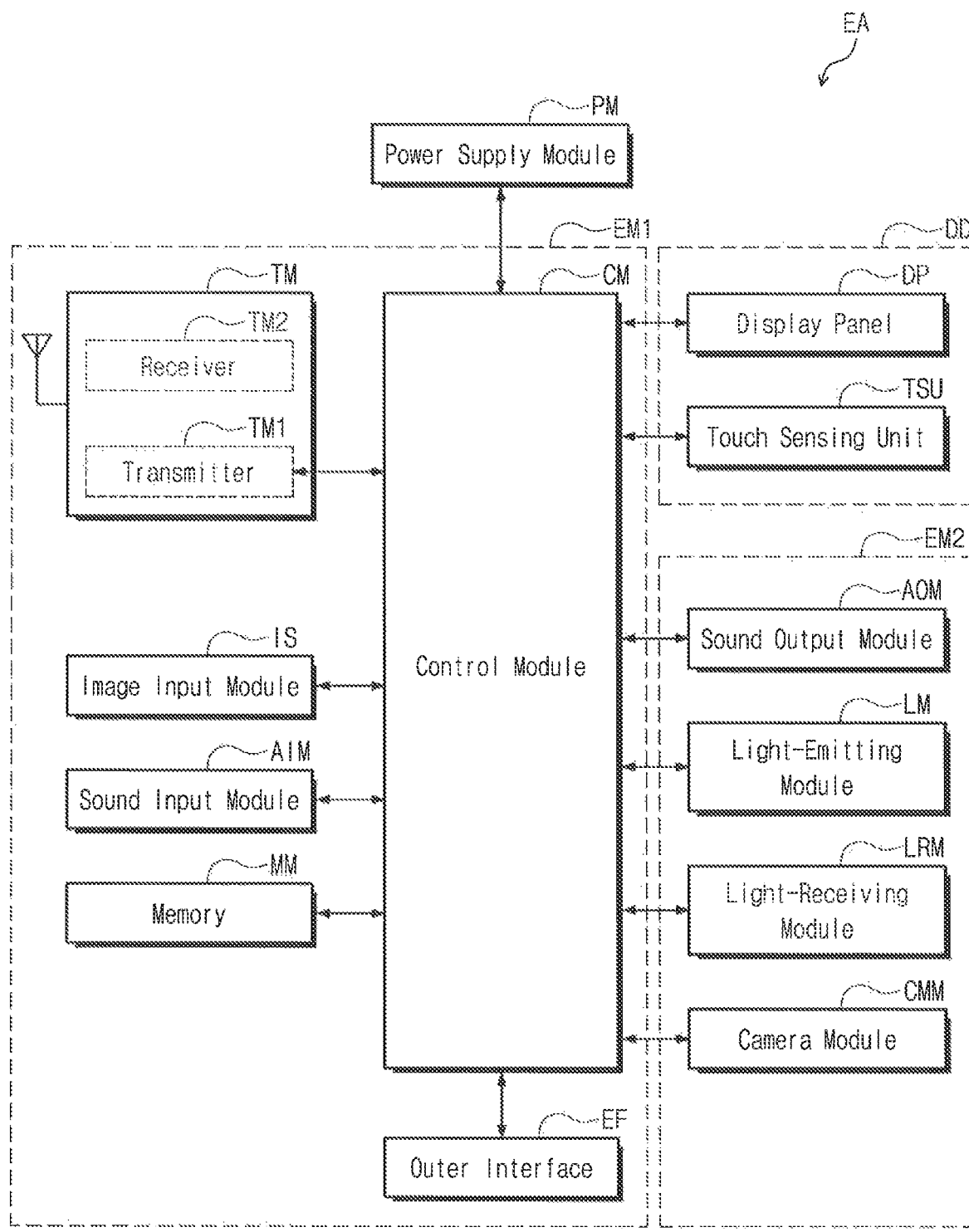
FIG. 3 is a block diagram of the electronic device of FIG. 1.

FIG. 1 is a perspective view illustrating an electronic display device according to an exemplary embodiment of the inventive concept. FIG. 2 is an exploded perspective view of the electronic device of FIG. 1. FIG. 3 is a block diagram of the electronic device of FIG. 1. Hereinafter, an electronic device according to an exemplary embodiment of the inventive concept will be described in more detail with reference to FIGS. 1 to 3.

As shown in FIGS. 1 to 3, an electronic device EA may include a front surface, which is used to display an image IM and serves as a display surface. The display surface may be parallel to a first direction DR1 and a second direction DR2. The display surface may include a transmission region TA and a bezel region BZA adjacent to the transmission region TA.

The transmission region TA of the electronic device EA may be used to display the image IM. In FIG. 1, an internet search window is illustrated as an example of the image IM. The transmission region TA may have a tetragonal or rectangular shape whose sides are parallel to the first direction DR1 and the second direction DR2. However, the inventive concept is not limited to this example, and in an exemplary embodiment of the inventive concept, a shape of a display region DA may be variously changed.

The bezel region BZA may be adjacent to the transmission region TA. The bezel region BZA may enclose the transmission region TA. However, the inventive concept is not limited to this example, and in an exemplary embodiment of the inventive concept, the bezel region BZA may be provided on one side of the transmission region TA or may be omitted. Furthermore, the inventive concept is not limited to a particular structure of the electronic device EA. For example, the electronic device EA may be provided in various forms.

Hereinafter, a direction that is normal to the display surface will be referred to as a thickness direction of the electronic device EA or a third direction DR3. In the present embodiment, a front or top surface and a rear or bottom surface of each element may be distinguished from each other, with respect to the third direction DR3 or a display direction of the image IM. For example, the front and rear surfaces may be two opposite surfaces facing each other in the third direction DR3.

In the present specification, directions indicated by the first to third directions DR1, DR2, and DR3 may be used to indicate other directions. Hereinafter, first to third directions may be directions indicated by the first to third directions DR1, DR2, and DR3, respectively, and will be referenced with the same numerals.

The electronic device EA may include a display panel DP, a window member WD, an electronic module ID, and a housing member HS. In an exemplary embodiment of the inventive concept, as shown in FIG. 3, the electronic device EA may further include a display module DD, a first electronic module EM1, a second electronic module EM2, and a power supply module PM. For convenience in illustration, some of elements illustrated in FIG. 3 are omitted from FIG. 2.

The display module DD may include a display panel DP and a touch sensing unit TSU. The display panel DP may be configured to generate the image IM. The touch sensing unit TSU may be configured to sense a user input provided from the outside. The user input may include various types of external inputs, such as a part of a user's body, light, heat, or pressure. In an exemplary embodiment of the inventive concept, the touch sensing unit TSU may be directly provided on the display panel DP. For example, the touch sensing unit TSU may be directly disposed on the display panel DP. To reduce complexity in the drawings, the touch sensing unit TSU may not be illustrated in FIG. 2.

The display panel DP may include a hole region PA, a display region DA, and a peripheral region NDA. As described above, the display region DA may be used to generate and display the image IM. For example, a plurality of pixels, which are used to generate light for the image IM, may be provided in the display region DA. This will be described in more detail below. The peripheral region NDA may be adjacent to the display region DA. The peripheral region NDA may enclose the display region DA. A driving circuit or a line driver for driving the display region DA may be provided in the peripheral region NDA.

A portion of the peripheral region NDA of the display panel DP may be curved or bent. For example, a portion of the peripheral region NDA may face the front surface of the electronic device EA, and another portion of the peripheral region NDA may face a rear surface of the electronic device EA. In an exemplary embodiment of the inventive concept, the peripheral region NDA may be omitted from the display panel DP.

The hole region PA may be enclosed by the display region DA. When viewed in a sectional view, a blocking groove BR, a module hole MH, and a filling member FM may be formed or provided in the hole region PA. In an exemplary embodiment of the inventive concept, the blocking groove BR, the module hole MH, and the filling member FM may be formed within the display region DA, which is a region for displaying an image.

The blocking groove BR may adjacent to the module hole MH. For example, the blocking groove BR may enclose the module hole MH. The module hole MH may penetrate the display panel DP. The module hole MH of FIG. 2 may be shaped like a circular cylinder extending in the third direction DR3. The module hole MH may be overlapped with an electronic module ID, when viewed in a plan view. The electronic module ID may be inserted into the module hole MH. In addition, the electronic module ID may be disposed on a rear surface of a base substrate 10 adjacent to the module hole MH, and only a part of the electronic module ID may be exposed to the outside through the module hole MH. For example, only a lens constituting a camera module CMM may be exposed to the outside through the module hole MH.

In an exemplary embodiment of the inventive concept, since the display panel DP includes the module hole MH formed in the display region DA, there is no need to provide an additional space for the electronic module ID in a region outside the display region DA. Thus, it is possible to reduce an area for the peripheral region NDA and to produce the electronic device EA with a narrow bezel. Furthermore, when the electronic module ID is provided within the module hole MH, it is possible to reduce a thickness of the electronic device EA. The blocking groove BR and the module hole MH will be described in more detail below.

The window member WD may be provided on the front surface of the electronic device EA. The window member WD may be provided on the front surface of the display panel DP and may be used to protect the display panel DP. For example, the window member WD may include a glass substrate, a sapphire substrate, or a plastic film. The window member WD may have a single- or multi-layered structure. For example, the window member WD may have a stacking structure including a plurality of plastic films, which are coupled to each other by an adhesive layer, or may have a stacking structure including a glass substrate and a plastic film, which are coupled to each other by an adhesive layer.

The window member WD may include the transmission region TA and the bezel region BZA. The transmission region TA may be a region of the window member WD corresponding to the display region DA. For example, the transmission region TA may be overlapped with the entire region or at least a region of the display region DA. The image IM displayed on the display region DA of the display panel DP may be provided to an external user through the transmission region TA.

A shape of the bezel region BZA may correspond to a shape of the transmission region TA. The bezel region BZA may be adjacent to the transmission region TA to enclose the transmission region TA. The bezel region BZA may have a predetermined color. The bezel region BZA may cover the peripheral region NDA of the display panel DP and prevent the peripheral region NDA from being recognized by a user. However, the inventive concept is not limited to the above example, and in an exemplary embodiment of the inventive concept, the bezel region BZA may be omitted from the window member WD.

The housing member HS may be coupled with the window member WD. The housing member HS may be the rear surface of the electronic device EA. The housing member HS may be coupled to the window member WD to form an internal space. The display panel DP, the electronic module ID, and several elements illustrated in FIG. 3 may be contained in the internal space. The housing member HS may include a material having a relatively high strength. For example, the housing member HS may include a plurality of frames and/or plates, each of which is formed of at least one of glass, plastic, or metallic materials. The housing member HS may be used to stably protect the elements of the electronic device EA, which are contained in the internal space, from an external impact.

The power supply module PM may be configured to supply an electric power to the electronic device EA. The power supply module PM may include a battery module.

The electronic module ID may include various functional modules, which are used to operate the electronic device EA. The electronic module ID may include the first electronic module EM1 and the second electronic module EM2.

The first electronic module EM1 may be directly mounted on a motherboard, which is electrically connected to the display module DD. Alternatively, the first electronic module EM1 may be mounted on another substrate and may be electrically connected to the motherboard through a connector.

The first electronic module EM1 may include a control module CM, a wireless communication module TM, an image input module IS, a sound input module AIM, a memory MM, and an outer interface EF. At least one of these modules may not be mounted on the motherboard and may be electrically connected to the motherboard through a flexible circuit board.

The control module CM may be configured to control overall operations of the electronic device EA. The control module CM may be, for example, a microprocessor. In an exemplary embodiment of the inventive concept, the display module DD may be activated or inactivated under the control of the control module CM. The control module CM may control other modules, such as the image input module IS or the sound input module AIM, based on touch signals received from the display module DD.

The wireless communication module TM may be configured to transmit and receive a wireless signal to and from another terminal via a Bluetooth or a Wi-Fi line. The wireless communication module TM may be configured to transmit and receive a voice signal via a communication line. The wireless communication module TM may include a transmitter TM1, which is configured to modulate and transmit a signal to be transmitted, and a receiver TM2, which is configured to demodulate a received signal.

The image input module IS may be configured to process an image signal and to convert the image signal into image data that can be displayed on the display module DD. The sound input module AIM may be configured to receive an external sound signal through a microphone in a recording mode or in a voice recognition mode and then to convert the sound signal into electrical voice data.

The outer interface EF may be configured to serve as an interface that is connected to an external charger, a wired/wireless data port, a card socket (e.g., a memory card or a subscriber identity module (SIM)/user identity module (UIM) card), and so forth.

The second electronic module EM2 may include a sound output module AOM, a light-emitting module LM, a light-receiving module LRM, and a camera module CMM. The modules of the second electronic module EM2 may be directly mounted on a motherboard. Alternatively, the modules of the second electronic module EM2 may be mounted on another substrate and may be electrically connected to the display module DD or the first electronic module EM1 through a connector.

The sound output module AOM may be configured to convert sound data, which are transmitted from the wireless communication module TM or are stored in the memory MM, and to output the converted sound data to the outside.

The light-emitting module LM may be configured to generate and emit light. In an exemplary embodiment of the inventive concept, the light-emitting module LM may be configured to emit infrared light. The light-emitting module LM may include a light emitting diode (LED) device. The light-receiving module LRM may be configured to sense infrared light. The light-receiving module LRM may be activated, when an infrared light incident thereto has an intensity higher than a reference value. The light-receiving module LRM may include a complementary metal oxide semiconductor (CMOS) sensor. The infrared light emitted from the light-emitting module LM may be reflected by an external object (e.g., a user's finger or face) and may be incident into the light-receiving module LRM. The camera module CMM may be used to obtain an image of an external object.

The electronic module ID of FIG. 2 may be one of the elements constituting the second electronic module EM2. Here, the first electronic module EM1 and the remaining elements of the second electronic module EM2 may be placed at other positions. However, the inventive concept is not limited to this example, and in an exemplary embodiment of the inventive concept, the electronic module ID may be at least one of the modules constituting the first and second electronic modules EM1 and EM2.

Figure 4A:
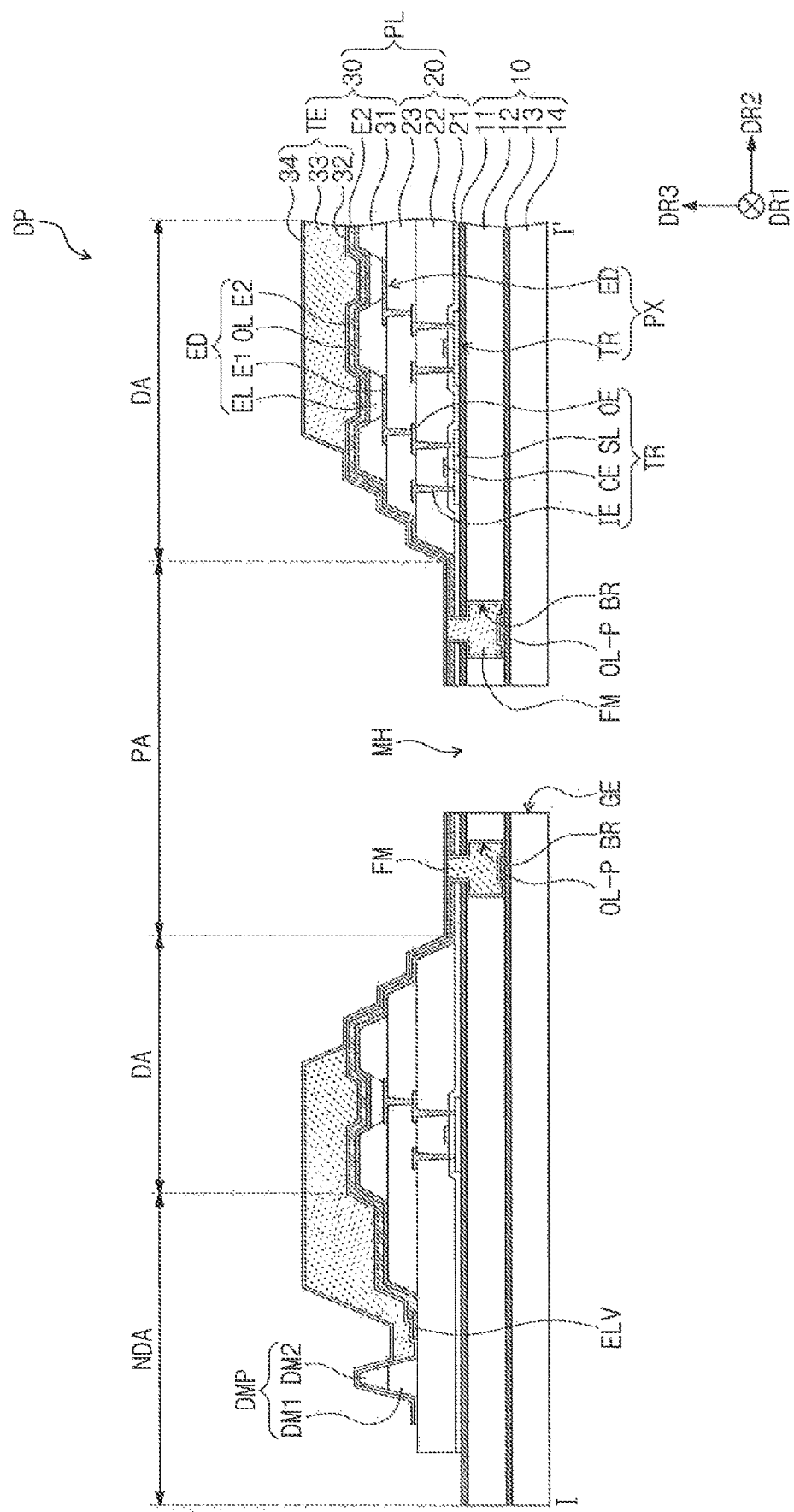
FIG. 4A is a sectional view taken along line I-I' of FIG. 2.
Figure 4B:
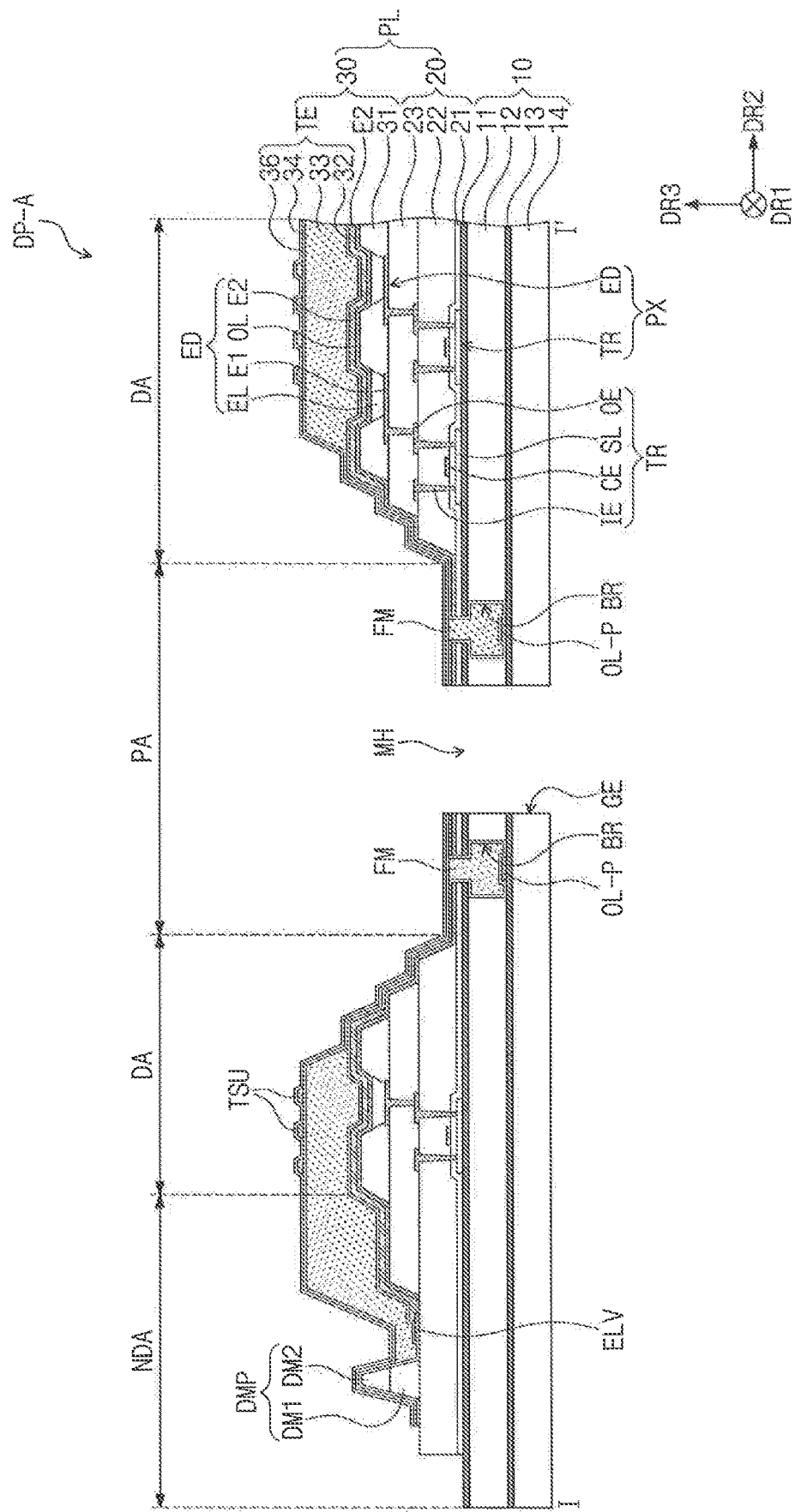
FIG. 4B is a sectional view illustrating an electronic device, in which a touch sensing unit, in addition to elements of FIG. 4A, is provided.

FIG. 4A is a sectional view taken along line I-I' of FIG. 2. FIG. 4B is a sectional view illustrating an electronic device, in which a touch sensor, in addition to elements of FIG. 4A, is provided. Hereinafter, an electronic device according to an exemplary embodiment of the inventive concept will be described with reference to FIGS. 4A and 4B.

As shown in FIG. 4A, the display panel DP may include a base substrate 10, a thin-film device layer 20, and a display device layer 30. The base substrate 10, the thin-film device layer 20, and the display device layer 30 may be stacked in the third direction DR3. In an exemplary embodiment of the inventive concept, the thin-film device layer 20 and the display device layer 30 may constitute a pixel layer PL.

The base substrate 10 may include a first barrier layer 11, a first base layer 12, a second barrier layer 13, and a second base layer 14.

A top surface of the first barrier layer 11 may be used as a front surface of the base substrate 10. The first barrier layer 11 may be an insulating layer containing an inorganic material. For example, the first barrier layer 11 may be formed of or include silicon oxide, silicon nitride, or amorphous silicon.

The first base layer 12 may be provided below the first barrier layer 11. The first base layer 12 may be an insulating layer containing an organic material. The first base layer 12 may include a flexible plastic material. For example, the first base layer 12 may be formed of or include polyimide (PI), polyethylene naphthalate (PEN), polyethylene terephthalate (PET), polyarylate, polycarbonate (PC), polyetherimide (PEI), or polyethersulfone (PES).

The second barrier layer 13 may be provided below the first base layer 12. The second barrier layer 13 may be formed of or include the same material as the first barrier layer 11.

The second base layer 14 may be provided below the second barrier layer 13. The first and second base layers 12 and 14 and the first and second barrier layers 11 and 13 may be alternatingly provided in the third direction DR3. The second base layer 14 may be formed of or include the same material as the first base layer 12. However, the inventive concept is not limited to this example, and in an exemplary embodiment of the inventive concept, the second barrier layer 13 and the second base layer 14 may be omitted from the display panel DP.

In an exemplary embodiment of the inventive concept, the base substrate 10 may further include a buffer layer. The buffer layer may be provided on the first barrier layer 11. The buffer layer may be formed of or include an inorganic or organic material. The buffer layer may be higher than the first barrier layer 11 in terms of an adhesion strength to a semiconductor pattern SL or a first insulating layer 21 to be described below. Accordingly, it is possible to more stably form the thin-film device layer 20 on the base substrate 10.

The thin-film device layer 20 may include a plurality of insulating layers and a thin-film transistor TR. The thin-film device layer 20 may be provided on the base substrate 10. Each of the insulating layers may be formed of or include inorganic or organic materials. The insulating layers may include first, second and third insulating layers 21, 22, and 23.

The thin-film transistor TR may include a semiconductor pattern SL, a control electrode CE, an input electrode IE, and an output electrode OE. The thin-film transistor TR may be configured to control current the flow of electric charges passing through the semiconductor pattern SL, based on signals applied to the control electrode CE, or to selectively output electrical signals, which are input from the input electrode IE, through the output electrode OE.

The semiconductor pattern SL may be provided on the base substrate 10. The semiconductor pattern SL may be formed of or include a crystalline semiconductor material or an amorphous silicon.

The first insulating layer 21 may be provided between the semiconductor pattern SL and the control electrode CE. In the present embodiment, the first insulating layer 21 is provided on the front surface of the first barrier layer 11 and covers the semiconductor pattern SL, but in an exemplary embodiment of the inventive concept, the first insulating layer 21 may expose the hole region PA.

The control electrode CE may be provided on the semiconductor pattern SL, as shown in FIGS. 4A and 4B. However, the inventive concept is not limited to this example, and in an exemplary embodiment of the inventive concept, the thin-film transistor TR may be configured to include the control electrode CE and the semiconductor pattern SL on the control electrode CE.

The second insulating layer 22 may be provided between the control electrode CE and the input electrode IE and between the control electrode CE and the output electrode OE. The input and output electrodes IE and OE may be provided on the second insulating layer 22. The input electrode IE and the output electrode OE may penetrate the first and second insulating layers 21 and 22 and may be coupled to two opposite portions of the semiconductor pattern SL, respectively. However, the inventive concept is not limited to these examples, and in an exemplary embodiment of the inventive concept, the input and output electrodes IE and OE may be directly coupled to the semiconductor pattern SL.

The third insulating layer 23 may be provided on the second insulating layer 22. The third insulating layer 23 may cover the thin-film transistor TR. The third insulating layer 23 may be used to electrically disconnect the thin-film transistor TR from the display device layer 30.

The display device layer 30 may include an organic light emitting device ED and a plurality of insulating layers. The insulating layers of the display device layer 30 may include a fourth insulating layer 31 and an encapsulation layer TE.

The fourth insulating layer 31 may be provided on the third insulating layer 23. A plurality of openings may be formed in the fourth insulating layer 31. The organic light emitting device ED may be provided in each of the openings.

The organic light emitting device ED may include a first electrode E1, a second electrode E2, a light emitting layer EL, and a charge control layer OL. The first electrode E1 may be provided on the thin-film device layer 20. The first electrode E1 may penetrate the third insulating layer 23 and may be electrically coupled to the thin-film transistor TR. In an exemplary embodiment of the inventive concept, a plurality of the first electrodes E1 may be provided. At least a portion of each of the first electrodes E1 may be exposed by a corresponding one of the openings in the fourth insulating layer 31.

The second electrode E2 may be provided on the first electrode E1. In an exemplary embodiment of the inventive concept, the second electrode E2 may be a single pattern, which is overlapped with a plurality of the first electrodes E1 and the fourth insulating layer 31. In the case where a plurality of the organic light emitting devices ED are provided, the second electrode E2 may be used to apply the same voltage to the plurality of the organic light emitting devices ED. In this case, the second electrode E2 may be formed without an additional patterning process. However, the inventive concept is not limited to this example, and in an exemplary embodiment of the inventive concept, a plurality of the second electrodes E2 may be provided to correspond to the openings in the fourth insulating layer 31, respectively.

The light emitting layer EL may be provided between the first electrode E1 and the second electrode E2. In an exemplary embodiment of the inventive concept, a plurality of the light emitting layers EL may be provided in the openings in the fourth insulating layer 31, respectively. In the organic light emitting device ED, a potential difference between the first and second electrodes E1 and E2 may be adjusted to selectively activate the light emitting layer EL or to allow the light emitting layer EL to emit light.

The charge control layer OL may be provided between the first electrode E1 and the second electrode E2. The charge control layer OL may be adjacent to the light emitting layer EL. In the present embodiment, the charge control layer OL may be provided between the light emitting layer EL and the second electrode E2, as illustrated in FIGS. 4A and 4B. However, the inventive concept is not limited to this example, and in an exemplary embodiment of the inventive concept, the charge control layer OL may be provided between the light emitting layer EL and the first electrode E1 or may include a plurality of layers, which are stacked in the third direction DR3 with the light emitting layer EL interposed therebetween.

The charge control layer OL may be formed without an additional patterning process, and thus, the charge control layer OL may be a single pattern that is overlapped with the front surface of the base substrate 10. The charge control layer OL may be provided on other regions, except for the openings formed in the fourth insulating layer 31. The charge control layer OL may be used to control motion of electrons and thereby increase light-emitting efficiency of the display panel DP. The charge control layer OL may include an electron transport layer and an electron injection layer.

The encapsulation layer TE may be provided on the organic light emitting device ED. The encapsulation layer TE may include inorganic or organic layers. In the present embodiment, the encapsulation layer TE may include a first inorganic layer 32, an organic layer 33, and a second inorganic layer 34.

Each of the first and second inorganic layers 32 and 34 may be formed of or include an inorganic material. For example, each of the first and second inorganic layers 32 and 34 may be formed of or include aluminum oxide, silicon oxide, silicon nitride, silicon oxynitride, silicon carbide, titanium oxide, zirconium oxide, or zinc oxide. The first and second inorganic layers 32 and 34 may be equal to or different from each other in terms of material.

The organic layer 33 may be provided between the first and second inorganic layers 32 and 34. The organic layer 33 may be formed of or include an organic material. The organic layer 33 may be formed of or include, for example, epoxy, polyimide (PI), polyethylene terephthalate (PET), polycarbonate (PC), polyethylene (PE), or polyacrylate.

Each of the first and second inorganic layers 32 and 34 may be a single pattern that is formed to substantially cover the front surface of the display panel 100, when viewed in a plan view. Each of the first and second inorganic layers 32 and 34 may be partially overlapped with the organic layer 33. For example, the first and second inorganic layers 32 and 34 may be spaced apart from each other in the third direction DR3 with the organic layer 33 interposed therebetween in a first region and may be in direct contact with each other in the third direction DR3 in a second region. The encapsulation layer TE may hermetically seal the organic light emitting device ED and thereby protect the organic light emitting device ED from an external contaminant.

In an exemplary embodiment of the inventive concept, the display panel DP may further include a dam portion DMP. The dam portion DMP may extend along an edge region of the display region DA (e.g., see FIG. 2). The dam portion DMP may enclose the display region DA or may be adjacent to at least a portion of the display region DA or adjacent to a pad or driving circuit.

The dam portion DMP may include a first dam DM1 and a second dam DM2. The first dam DM1 may be formed of or include the same material as the third insulating layer 23. The first dam DM1 may be formed using a process of forming the third insulating layer 23 and may be provided on the same layer as the third insulating layer 23.

The second dam DM2 may be stacked on the first dam DM1. The second dam DM2 may be formed of or include the same material as the fourth insulating layer 31. The second dam DM2 may be formed using a process of forming the fourth insulating layer 31 and may be formed on the same layer as the fourth insulating layer 31. However, the inventive concept is not limited to these examples, and in an exemplary embodiment of the inventive concept, the dam portion DMP may have a single-layered structure.

In an exemplary embodiment of the inventive concept, a liquid organic material may be supplied to form the organic layer 33, and during the formation of the organic layer 33, the dam portion DMP may be used to delimit a spreading boundary of the liquid organic material. In other words, the dam portion DMP may be used to limit how far the liquid organic material spreads. The organic layer 33 may be formed by coating the first inorganic layer 32 with a liquid organic material using an inkjet method. In this case, the dam portion DMP may prevent the liquid organic material from overflowing to an area outside of the dam portion DMP, thereby delimiting the spreading boundary of the liquid organic material.

In an exemplary embodiment of the inventive concept, the display panel DP may further include a supplementary electrode pattern ELV. The supplementary electrode pattern ELV may be provided on the peripheral region NDA and may be electrically coupled to the second electrode E2 extended from the display region DA. The supplementary electrode pattern ELV may be used to stably supply a power voltage, which is provided from the outside of the display panel DP, to the second electrode E2.

In the present embodiment, the supplementary electrode pattern ELV may be provided between the second insulating layer 22 and the third insulating layer 23. The supplementary electrode pattern ELV may be provided on the same layer as the input and output electrodes IE and OE. However, the inventive concept is not limited to this example, and in an exemplary embodiment of the inventive concept, a position of the supplementary electrode pattern ELV may be variously changed.

The module hole MH may be provided in the hole region PA. The module hole MH may penetrate the base substrate 10. For example, the module hole MH may be formed by partially removing the base substrate 10, the first insulating layer 21, the charge control layer OL, the first inorganic layer 32, and the second inorganic layer 34.

Since the module hole MH penetrates the display panel DP, some of elements constituting the display panel DP may have ends defined by the module hole MH. For example, as a result of the formation of the module hole MH, the base substrate 10 may have ends 11E, 12E, 13E, and 14E, the first insulating layer 21 may have an end 21E, the charge control layer OL may have an end OLE, the first inorganic layer 32 may have an end 32E, and the second inorganic layer may have an end 34E. In an exemplary embodiment of the inventive concept, the ends 11E, 12E, 13E, 14E, 21E, OLE, 32E, and 34E may be aligned to each other to form an inner surface GE of the module hole MH.

The blocking groove BR may be provided in the hole region PA. The blocking groove BR may be a recessed region, which is formed by removing a portion of the base substrate 10. In an exemplary embodiment of the inventive concept, the first inorganic layer 32 may cover the recessed region and thereby define an inner surface of the blocking groove BR.

The filling member FM may be provided on the inner surface of the blocking groove BR. The filling member FM may include a liquid organic material and may fill the blocking groove BR. In an exemplary embodiment of the inventive concept, the blocking groove BR may be formed of or include the same material as the organic layer 33.

In the display panel DP according to an exemplary embodiment of the inventive concept, the touch sensing unit TSU may be directly formed on the encapsulation layer TE, as shown in FIG. 4B. The touch sensing unit TSU may include a touch sensing part provided on the display region DA and touch signal lines provided on the peripheral region NDA. In an exemplary embodiment of the inventive concept, the touch sensing part may not be overlapped with the organic light emitting device ED, when viewed in a plan view.

The signal touch signal lines may be coupled to the touch sensing part.

In an exemplary embodiment of the inventive concept, the touch sensing unit TSU may have a multi- or single-layered structure. In an exemplary embodiment of the inventive concept, the touch sensing unit TSU may be configured to sense an external input in a mutual-capacitance manner and/or a self-capacitance manner. A third inorganic layer 36 may cover the touch sensing unit TSU. The third inorganic layer 36 may cover the second inorganic layer 34.

Figure 5A:
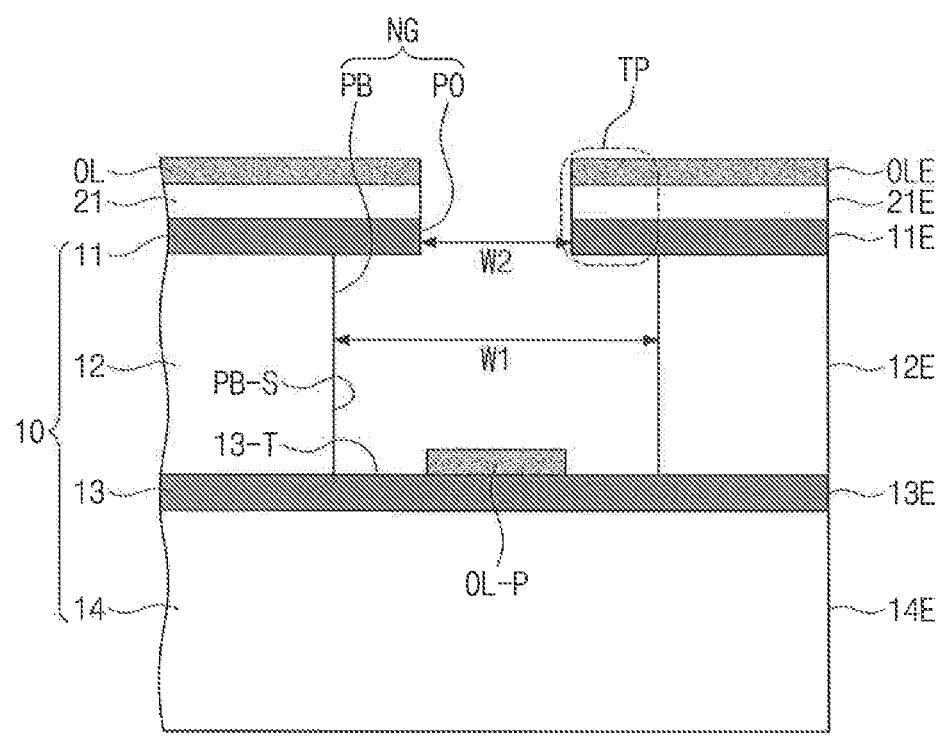
FIGS. 5A and 5B are sectional views each illustrating a hole region of FIG. 4A.
Figure 5B:
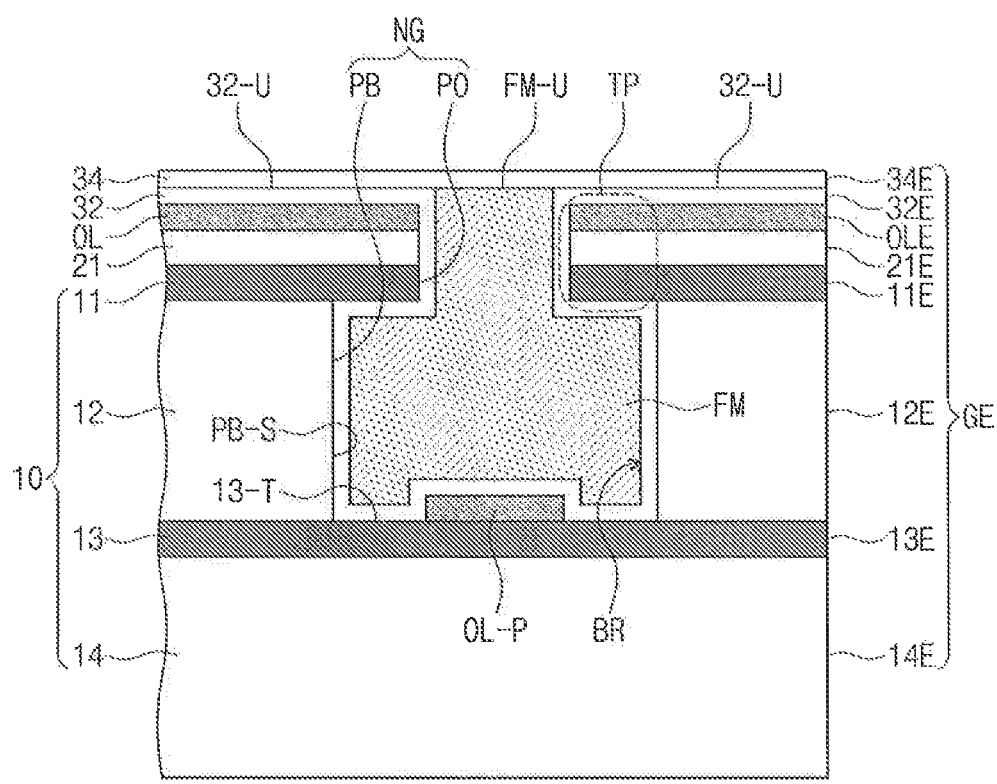

FIGS. 5A and 5B are sectional views each illustrating a hole region of FIG. 4A. For convenience in illustration, each of FIGS. 5A and 5B illustrates an enlarged shape of the blocking groove BR. To reduce complexity in the drawings, some (e.g., the filling member FM, the first inorganic layer 32, and the second inorganic layer 34) of elements constituting the blocking groove BR of FIG. 4A are omitted from FIG. 5A.

Referring to FIG. 5A, the blocking groove BR may have an internal space NG, which is recessed from the front surface of the base substrate 10. The internal space NG may include a patterned portion PB and an opening PO.

The patterned portion PB may be an empty space, which is formed by recessing the top surface of the first base layer 12. In an exemplary embodiment of the inventive concept, the patterned portion PB may be provided in the form of a through hole. For example, the patterned portion PB may penetrate the first base layer 12 and expose a portion of the second barrier layer 13.

The opening PO may be an empty space, which is formed by removing a portion of the first barrier layer 11. The opening PO may be overlapped with the patterned portion PB, when viewed in a plan view. The opening PO, along with the patterned portion PB, may define the internal space NG.

Inner side surfaces of the patterned portion PB may be spaced apart from each other by a distance of a first width W1, in the second direction DR2. The opening PO may have a second width W2 in the second direction DR2. In an exemplary embodiment of the inventive concept, the first width W1 may be larger than the second width W2.

A portion of the first barrier layer 11 located between the blocking groove BR and the module hole MH may include one end 11E adjacent to the module hole MH and an opposite end adjacent to the blocking groove BR. The opposite end of the first barrier layer 11 may define a part of a side surface of the opening PO. The opposite end of the first barrier layer 11 may be positioned in such a way that a distance between the opposite end and the module hole ME is larger than a distance from an inner side surface PB-S of the blocking groove BR and the module hole MH. For example, the opposite end of the first barrier layer 11 may have a shape protruding from a portion of an inner side surface PB-S of the blocking groove BR adjacent to the module hole MH. Thus, when viewed in a plan view, the opposite end of the first barrier layer 11 defining the opening PO may cover a portion of the patterned portion PB.

The one end 11E of the first barrier layer 11 may define a portion of the module hole MH. For example, the one end 11E of the first barrier layer 11 may be aligned to the end 21E of the first insulating layer 21.

Although an embodiment of the inventive concept has been described with reference to the first barrier layer 11 with the two opposite ends, each of other layers (e.g., the first insulating layer 21 and the charge control layer OL), which are provided between the blocking groove BR and the module hole HM, may also be provided to have the same or similar structure as that of the first barrier layer 11.

As shown in FIG. 5A, an additional pattern OL-P may be further provided in the internal space NG of the blocking groove BR. In an exemplary embodiment of the inventive concept, the additional pattern OL-P may be provided on an exposed surface 13-T of the second barrier layer 13 exposed by the patterned portion PB. A portion of the additional pattern OL-P may be overlapped with an opening, when viewed in a plan view. The additional pattern OL-P may be formed of or include the same material as at least one of the elements constituting the organic light emitting device ED.

A tip portion TP protruding from the inner side surface PB-S of the patterned portion PB may be formed. For example, the tip portion TP may be composed of protruding portions of the first barrier layer 11, the first insulating layer 21, and the charge control layer OL. In an exemplary embodiment of the inventive concept, the tip portion TP may be defined by an under-cut region of the first base layer 12.

In FIG. 5B, the filling member FM, the first inorganic layer 32, and the second inorganic layer 34 are further illustrated, in addition to the elements of FIG. 5A.

The first inorganic layer 32 may cover the internal space NG of the blocking groove BR. For example, the first inorganic layer 32 may cover the inner side surface PB-S of the patterned portion PB, the exposed surface 13-T, the additional pattern OL-P, and the tip portion TP, thereby defining an inner surface of the blocking groove BR.

The filling member FM may fill the blocking groove BR provided with the first inorganic layer 32. The filling member FM may be in contact with the first inorganic layer 32 covering the internal space NG. The second inorganic layer 34 may cover a top surface FM-U of the filling member FM and a top surface 32-U of the first inorganic layer 32 adjacent thereto. For example, the second inorganic layer 34 may be in direct contact with a portion of the first inorganic layer 32 adjacent to the blocking groove BR. The filling member FM may be formed of or include the same material as the organic layer 33 of the encapsulation layer TE.

Since the module hole MH penetrates the display panel DP, some of the elements constituting the display panel DP may have ends defined by the module hole MH. For example, as a result of the formation of the module hole MH, the base substrate 10 may have ends 11E, 12E, 13E, and 14E, the first insulating layer 21 may have an end 21E, the charge control layer OL may have an end OLE, the first inorganic layer 32 may have an end 32E, and the second inorganic layer may have an end 34E. In an exemplary embodiment of the inventive concept, the ends 11E, 12E, 13E, 14E, 21E, OLE, 32E, and 34E may be aligned to each other to define the inner surface GE of the module hole MH.

In an exemplary embodiment of the inventive concept, the filling member FM may be provided in the blocking groove BR to support the tip portion TP. Since the tip portion TP is supported by the filling member FM, the display panel DP may have an increased impact-resistant property. In addition, since a portion of the inner surface GE of the module hole MH exposed to the outside is defined by the first and second inorganic layers 32 and 34, which are in contact with each other, and the portion of the inner surface GE of the module hole MH is spaced apart from the filling member FM, it is possible to block a contamination material (e.g., moisture and/or oxygen) supplied from the outside. In other words, it is possible to increase reliability of the display panel DP.

FIGS. 6A to 6E are sectional views each illustrating a portion of a display panel according to an exemplary embodiment of the inventive concept. Hereinafter, an element previously described with reference to FIGS. 1 to 5B may be identified by the same reference number without repeating an overlapping description thereof.

Figure 6A:
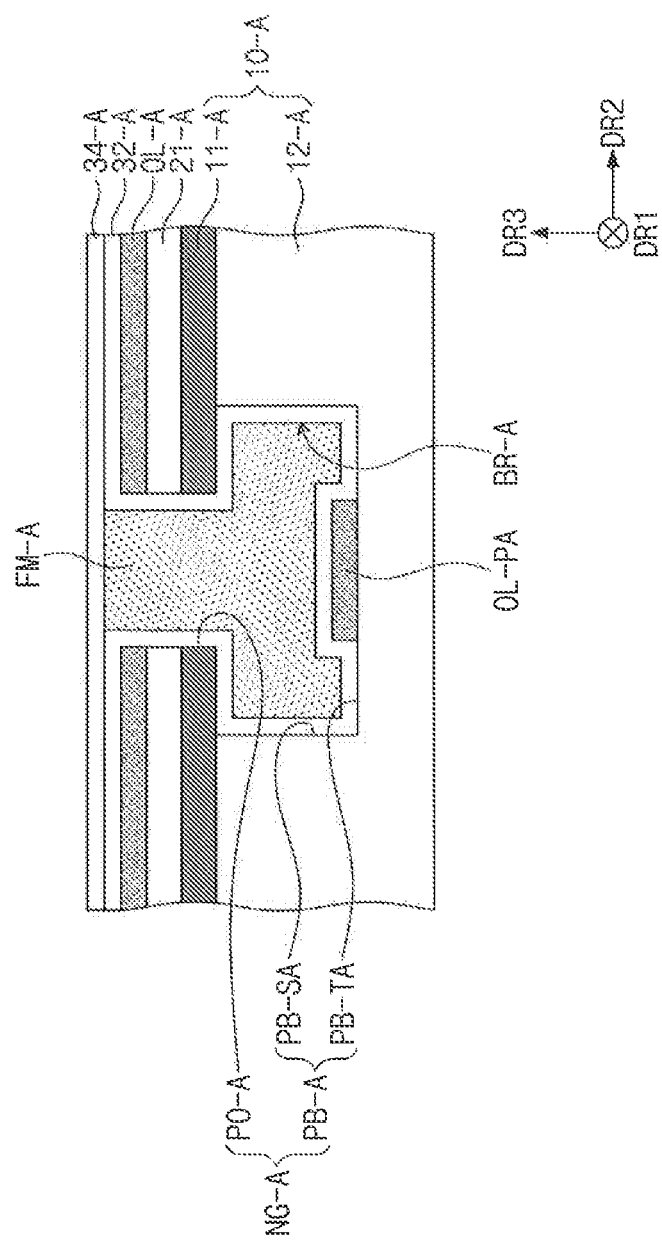

In an embodiment of FIG. 6A, a base substrate 10-A may have a single-layered structure. For example, the base substrate 10-A may be configured to have only a barrier layer 11-A and a base layer 12-A. In an exemplary embodiment of the inventive concept, the base layer 12-A may be partially removed to form a patterned portion PB-A as an empty space. The patterned portion PB-A may include an inner side surface PB-SA and a bottom surface PB-TA. A first inorganic layer 32-A may cover an inner space NG-A of a blocking groove BR-A. In this case, the blocking groove BR-A may not penetrate the first base layer 12-A and may be provided in the first base layer 12-A. Furthermore, an additional pattern OL-PA may be provided on the bottom surface PB-TA. In FIG. 6A, FM-A refers to a filling member, and OL-A refers to a charge control layer, for example. In the rest of FIGS. 6B to 6E, the aforementioned reference numerals may be additionally denoted with a "B, C, D, or Z" depending on which figure they are illustrated in. For example, in FIG. 6B, FM-B may refer to a filling member.

Figure 6B:
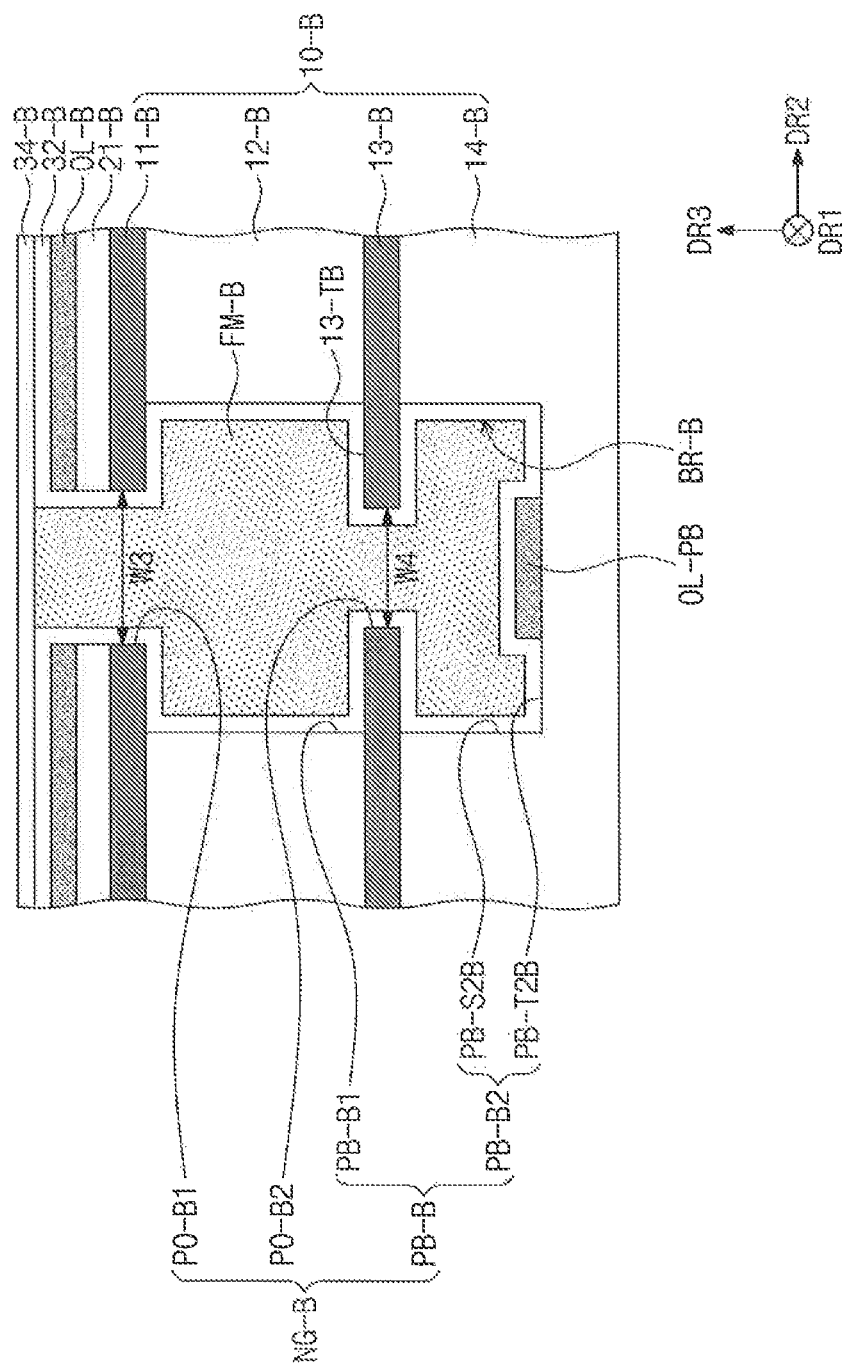

Referring to FIG. 6B, a blocking groove PB-B may include a plurality of patterned portions PB-B1 and PB-B2 and a plurality of openings PO-B1 and PO-B2, unlike the blocking groove PB-A of FIG. 6A. In an exemplary embodiment of the inventive concept, the blocking groove PB-B may include a first opening PO-B1, a second opening PO-B2, a first patterned portion PB-B1, and a second patterned portion PB-B2.

The first opening PO-B1 may be formed by removing a portion of a first barrier layer 11-B. The first patterned portion PB-B1 may penetrate a first base layer 12-B. The first patterned portion PB-B1 may include an inner side surface.

The second the opening PO-B2 may be formed by removing a portion of a second barrier layer 13-B. The second opening PO-B2 may be overlapped with the first opening PO-B1, when viewed in a plan view. The second patterned portion PB-B2 may be formed by recessing a portion of a second base layer 14-B. The second patterned portion PB-B2 may include an inner side surface PB-S2B and a bottom surface PB-T2B.

Thus, an internal space NG-B of a blocking groove BR-B may be defined by the first opening PO-B1, the first patterned portion PB-B1, an exposed surface 13-TB of the second barrier layer 13-B, the second opening PO-B2, and the second patterned portion PB-B2. The exposed surface 13-TB of the second barrier layer 13-B is exposed by the first patterned portion PB-B1.

In the present embodiment, a first width W3 in the second direction DR2 of the first opening PO-B1 may be larger than a second width W4 in the second direction DR2 of the second opening PO-B2.

A filling member FM-B may fill at least a portion of the blocking groove BR-B covered with a first inorganic layer 32-B. The filling member FM-B may be used to support a portion of the first barrier layer 11-B protruding from an inner side surface of the first base layer 12-B and a portion of the second barrier layer 13-B protruding from an inner side surface of the second base layer 14-B. Furthermore, an additional pattern OL-PB may be provided on the bottom surface PB-T2B.

Referring to FIG. 6C, unlike the blocking groove PB-B of FIG. 6B, a patterned portion PB-C may be provided to have a varying width in the third direction DR3. The patterned portion PB-C may include an inner side surface.

A first inorganic layer 32-C may cover the patterned portion PB-C, and a filling member FM-C may be provided in a blocking groove BR-C. The first inorganic layer 32-C and the filling member FM-C may have shapes corresponding to a shape of the inner side surface of the patterned portion PB-C. FIG. 6C illustrates an example in which the patterned portion PB-C is provided on a second barrier layer 13-C, but the inventive concept is not limited thereto. For example, in each of the blocking grooves shown in FIGS. 6A and 6B, the patterned portion PB-C may be provided to have a varying width. Furthermore, an additional pattern OL-PC may be provided on the second barrier layer 13-C.

In an exemplary embodiment of the inventive concept, as shown in FIG. 6D, an organic pattern may be omitted from an electronic device. Thus, the first inorganic layer 32-D may cover a front surface of the exposed surface 13-TD. FIG. 6D illustrates an example in which a patterned portion PB-D is provided on a second barrier layer 13-D, but the inventive concept is not limited thereto. For example, the organic pattern may be omitted in each of the blocking grooves shown in FIGS. 6A to 6C.

Figure 6E:
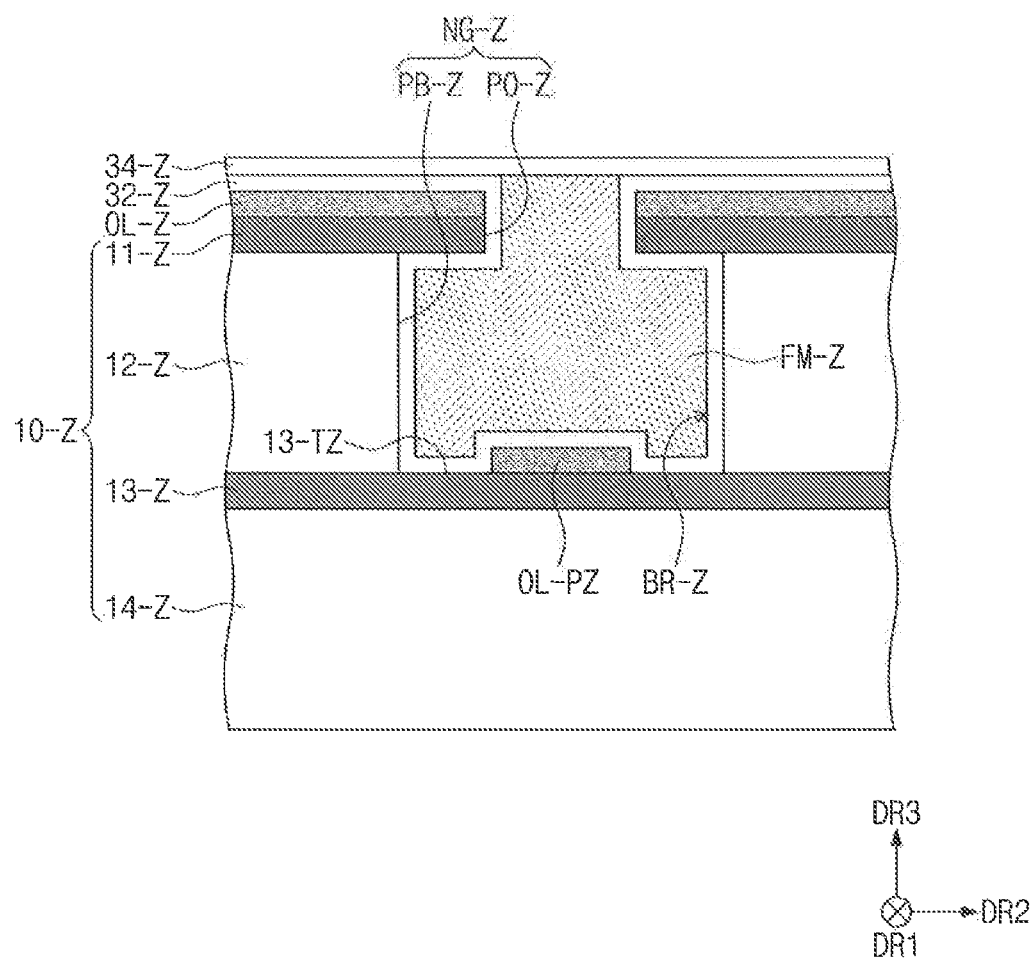

Referring to FIG. 6E, unlike the structure shown in FIG. 5B, the second insulating layer 21 or 21E (e.g., see FIG. 5B) may be omitted on a first insulating layer 11-Z adjacent to an opening PO-Z. For example, a charge control layer OL-Z may be directly provided on the first insulating layer 11-Z adjacent to the opening PO-Z. The structure of FIG. 6E, from which the second insulating layer is omitted, may be applied to the structures of FIGS. 6A to 6D. In other words, the second insulating layer may be omitted from a region adjacent to the blocking groove BR-A, BR-B, BR-C and BR-D shown in FIGS. 6A to 6D. Furthermore, an additional pattern OL-PZ may be provided on a second barrier layer 13-Z.

In the present embodiment, since the second insulating layer 21 or 21E is omitted from a region adjacent to a blocking groove BR-Z, it is possible to reduce a thickness of the tip portion TP (e.g., see FIG. 5B) covered with a first inorganic layer 32-Z. This may allow the tip portion TP, which is supported by the first inorganic layer 32-Z, to have an increased impact-resistant strength. As a result, the blocking groove BR-Z may have a robust structure.

FIG. 7 is a sectional view illustrating a portion of a display panel according to an exemplary embodiment of the inventive concept. For concise description, an element previously described with reference to FIGS. 4A to 5B may be identified by the same reference number without repeating an overlapping description thereof. The display panel of FIG. 7 may be configured to have substantially the same features as one of the structures described with reference to FIGS. 6A to 6B.

In an exemplary embodiment, a display panel DP-1 may include a plurality of blocking grooves BR1 and BR2. The blocking grooves BR1 and BR2 may be spaced apart from each other, in the hole region PA. Each of the blocking grooves BR1 and BR2 may enclose the module hole MH.

As shown in FIG. 7, the plurality of blocking grooves BR1 and BR2 may include a first blocking groove BR1 and a second blocking groove BR2. The first blocking groove BR1 may be closer to the module hole MH than the second blocking groove BR2. As shown in FIG. 7, the first and second blocking grooves BR1 and BR2 may have substantially the same sectional shape. However, the inventive concept is not limited to this example, and in an exemplary embodiment of the inventive concept, the blocking grooves may have different shapes.

The first inorganic layer 32 may enclose an internal space of each of the first and second blocking grooves BR1 and BR2, thereby defining an inner surface of each of the first and second blocking grooves BR1 and BR2. A first filling member FM1 may be provided on the inner surface of the first blocking groove BR1, and a second filling member FM2 may be provided on the inner surface of the second blocking groove BR2. For example, the first and second filling members FM1 and FM2 may fill at least a portion of the internal space of a corresponding one of the first and second blocking grooves BR1 and BR2.

In the present embodiment, the first filling member FM1, the second filling member FM2, and the first inorganic layer 32 adjacent to the first and second filling members FM1 and FM2 may be covered with the second inorganic layer 34. For example, the second inorganic layer 34 may be in contact with a top surface FM1-U of the first filling member FM1 and a top surface FM2-U of the second filling member FM2. In FIG. 7, OL-P1 and OL-P2 may refer to first and second additional patterns.

According to the above embodiments of the inventive concept, a plurality of blocking grooves may be provided, and this makes it possible to more effectively prevent moisture and/or oxygen from entering the display panel DP-1. Accordingly, it is be possible to realize the display panel DP-1 with increased reliability.

Figure 8A:
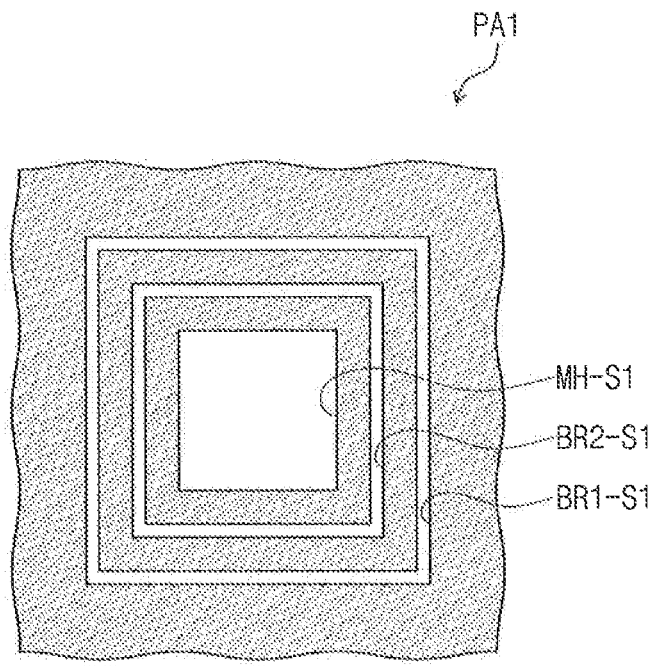
FIGS. 8A, 8B and 8C are plan views each illustrating a hole region according to an exemplary embodiment of the inventive concept.
Figure 8B:
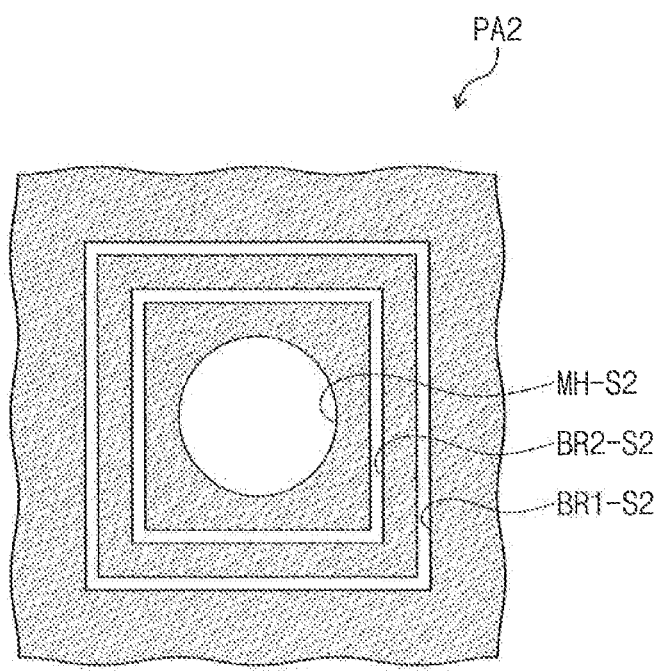
Figure 8C:
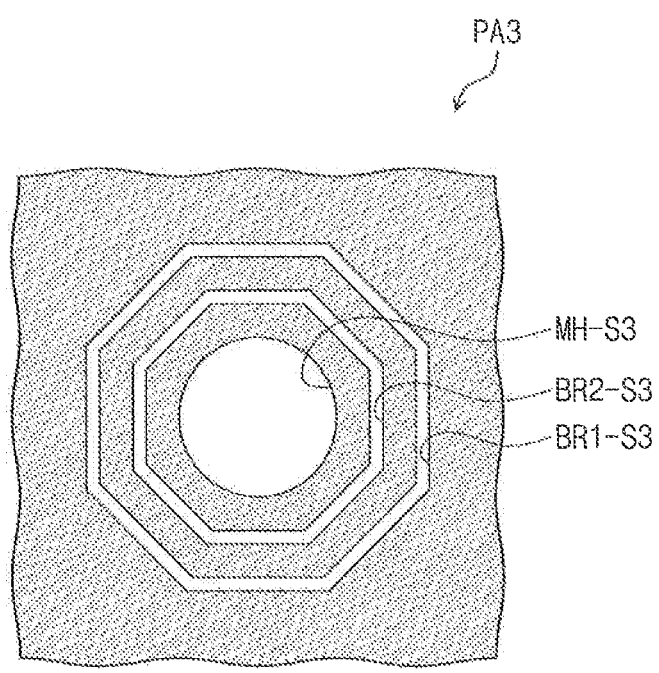

FIGS. 8A to 8C are plan views each illustrating a hole region according to an exemplary embodiment of the inventive concept. For convenience in illustration, in FIGS. 8A to 8C, some elements, which are provided in regions corresponding to hole regions PA1, PA2, and PA3, are illustrated with hatched patterns. In addition, the first inorganic layer 32 and the second inorganic layer 34, which are provided in the hole region PA of FIG. 4A, are omitted from FIGS. 8A to 8C. Hereinafter, the structures of hole regions according to exemplary embodiments of the inventive concept will be described with reference to FIGS. 8A to 8C.

As shown in FIG. 8A, the hole region PA1 may include a module hole MH-S1 and blocking grooves BR1-S1 and BR2-S1. The module hole MH-S1 may have a polygonal shape, when viewed in a plan view. For example, the module hole MH-S1 may have a rectangular shape, as shown in FIG. 8A. In exemplary embodiments of the inventive concept, the module hole MH-S1 may have a polygonal pillar shape. The first blocking groove BR1-S1 and the second blocking groove BR2-S1 may be spaced apart from each other.

The first and second blocking grooves BR1-S1 and BR2-S1 may be formed along an edge of the module hole MH-S1. In an exemplary embodiment of the inventive concept, at least one of the first and second blocking grooves BR1-S1 and BR2-S1 may have a shape corresponding to the module hole MH-S1. For example, each of the first and second blocking grooves BR1-S1 and BR2-S1 may be shaped like a rectangular closed line enclosing the module hole MH-S1, when viewed in a plan view.

As shown in FIG. 8B, the hole region PA2 may include a module hole MN-S2 and blocking grooves BR1-S2 and BR2-S2, which have different shapes from each other. For example, when viewed in a plan view, the module hole MH-S2 may be provided to have a circular shape, and the blocking grooves BR1-S2 and BR2-S2 may have a planar shape different from the module hole MH-S2. As shown in FIG. 8B, each of the blocking grooves BR1-S2 and BR2-S2 may be shaped like a rectangular closed line, but the inventive concept is not limited to this example. For example, in an exemplary embodiment of the inventive concept, the shape of at least one of the blocking grooves BR1-S2 and BR2-S2 may be variously changed, independent of the shape of the module hole MH-S2, if such a blocking groove is located adjacent to the module hole MH-S2.

As shown in FIG. 8C, the hole region PA3 may include a module hole MH-S3 and blocking grooves BR1-S3 and BR2-S3, which have different shapes from each other. For example, when viewed in a plan view, the module hole MH-S3 may have a circular shape, and each of the blocking grooves BR1-S3 and BR2-S3 may be shaped like an octagonal closed line.

The smaller a difference in planar shapes between the blocking grooves BR1-S3 and BR2-S3 and the module hole MH-S3, the smaller an area of a region between the blocking grooves BR1-S3 and BR2-S3 and the module hole MH-S3. In other words, in the case where the difference in planar shapes between the blocking grooves BR1-S3 and BR2-S3 and the module hole MH-S3 is small, it is possible to reduce an area of the hole region PA3 provided in the display region DA (e.g., see FIG. 2) and thereby reduce an influence of the hole region PA3 on the display region DA.

Figure 9A:
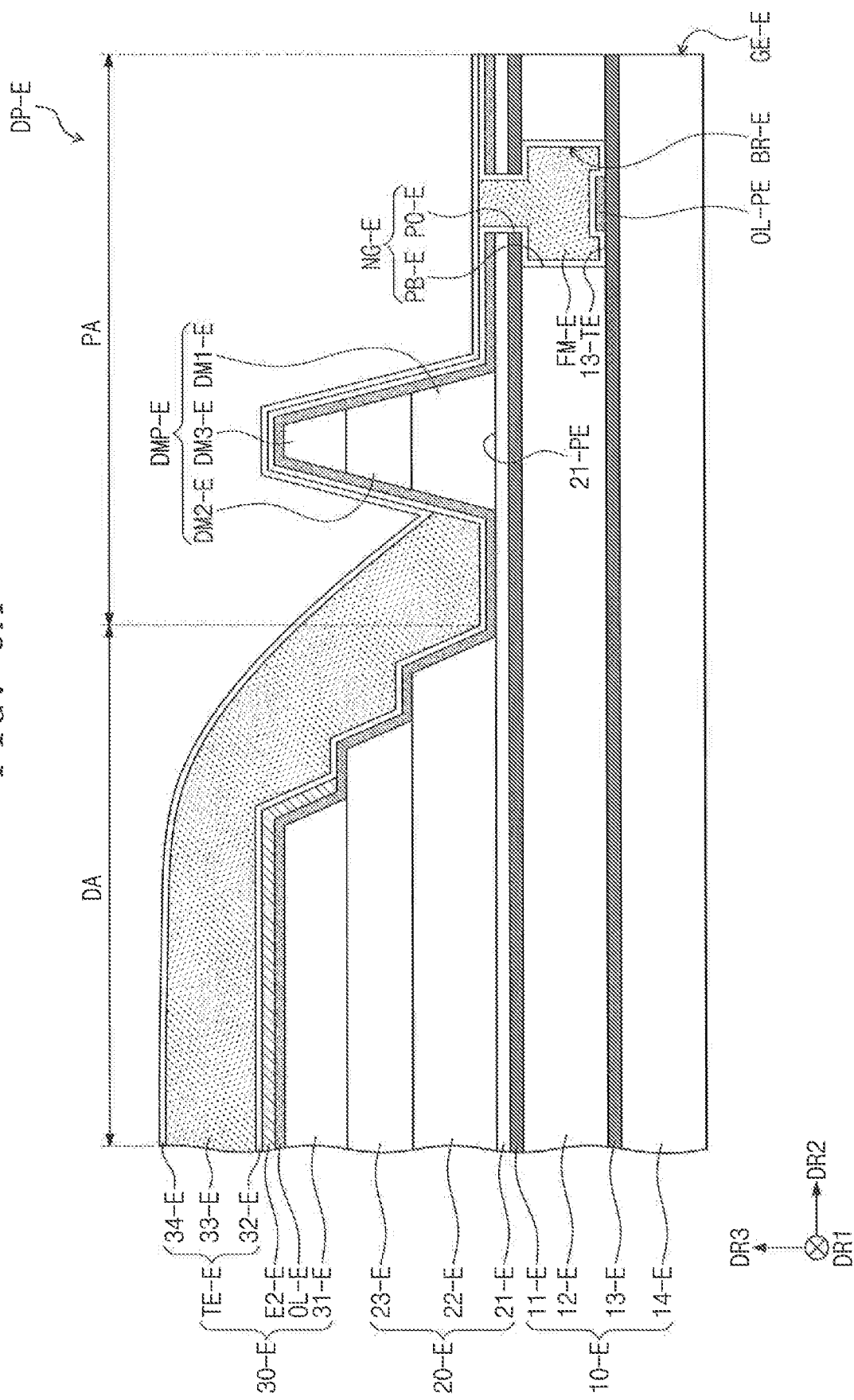
FIGS. 9A, 9B and 9C are sectional views each illustrating a display panel according to an exemplary embodiment of the inventive concept.
Figure 9B:
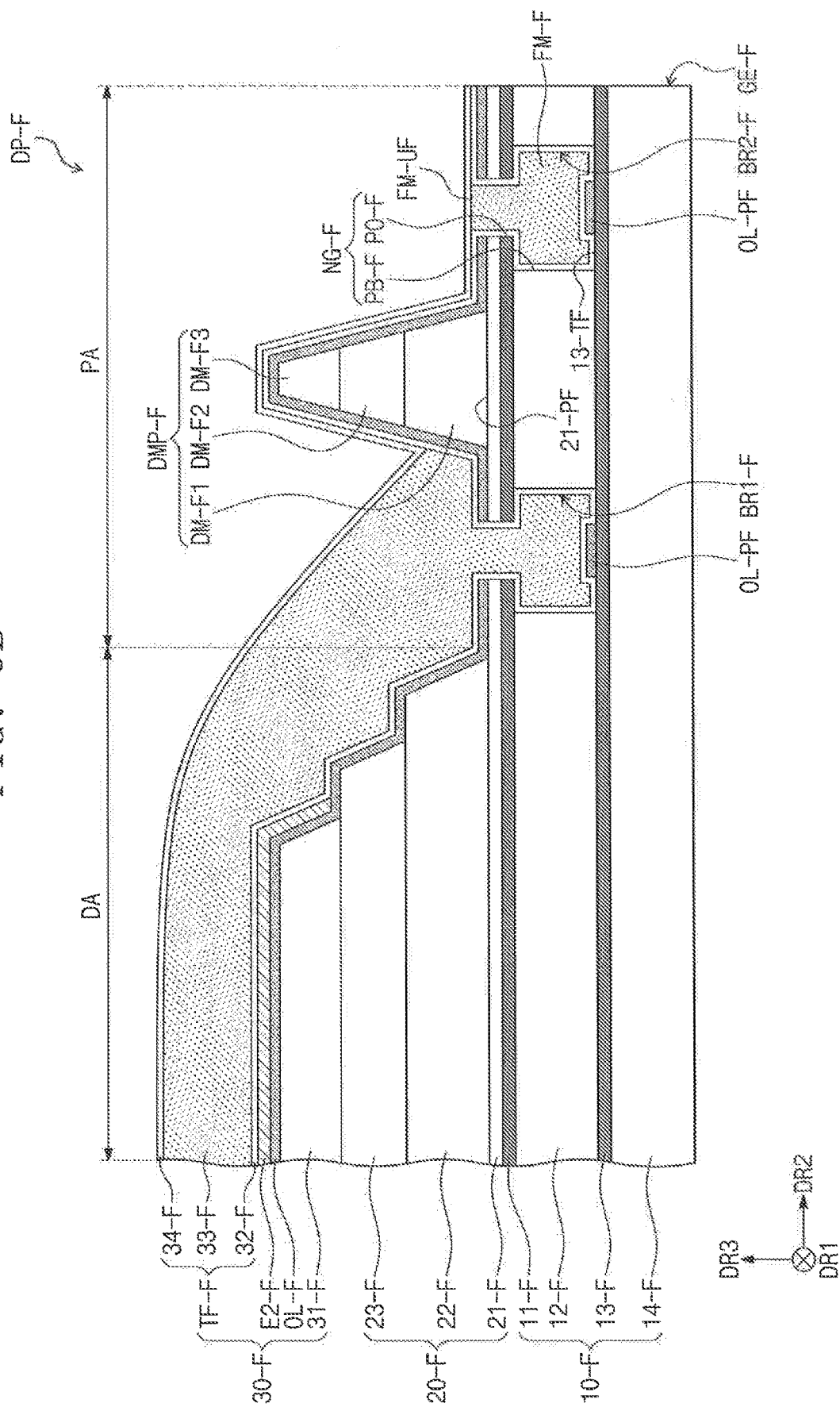
Figure 9C:
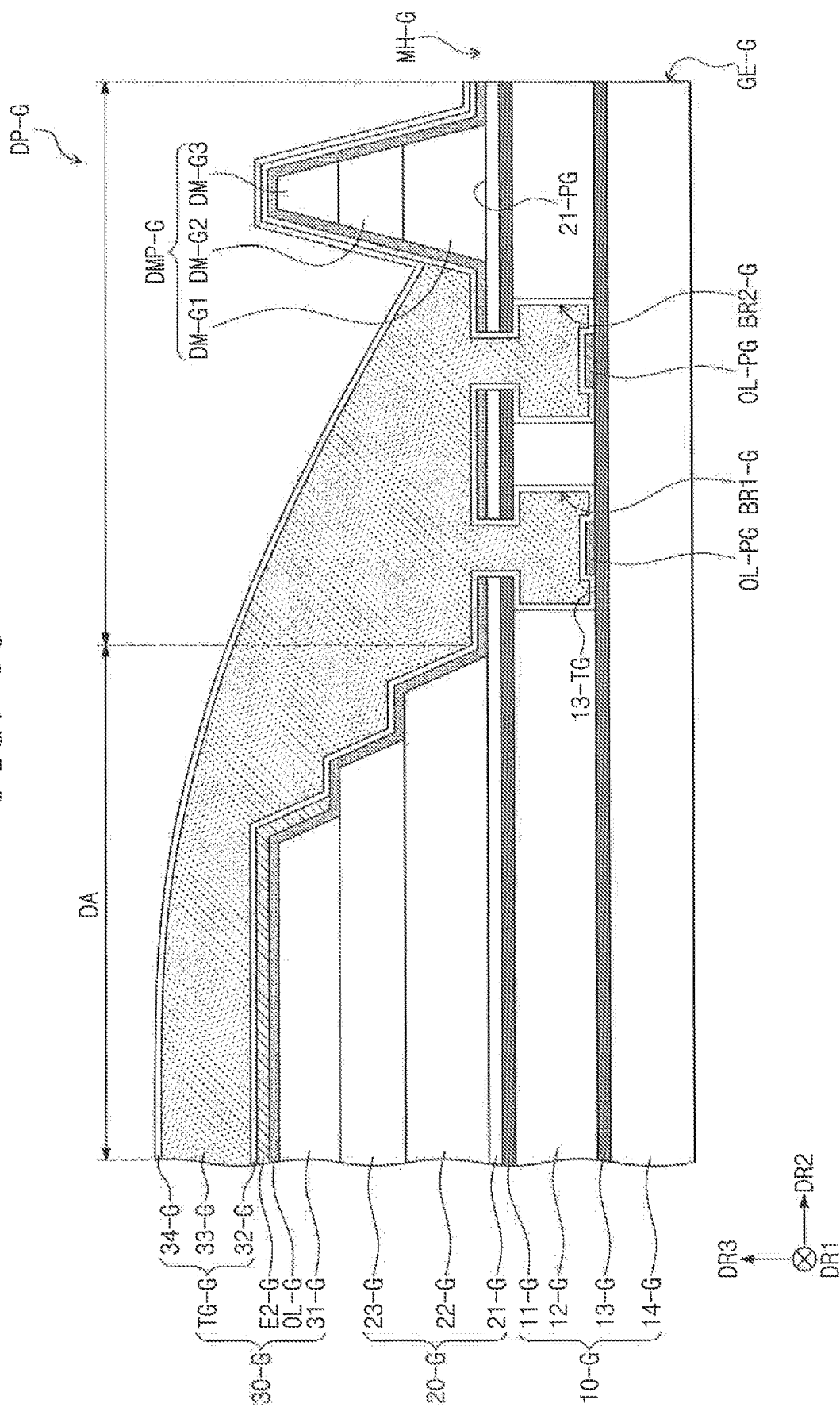

FIGS. 9A to 9C are sectional views each illustrating a display panel according to an exemplary embodiment of the inventive concept. For concise description, an element previously described with reference to FIGS. 4A to 5B may be identified by the same reference number without repeating an overlapping description thereof. In FIGS. 9A to 9C, the reference numerals may be denoted with an "E, F, or G" depending on which figure they are illustrated in. For example, in FIG. 9B, DMP-F may refer to a partition wall member.

As shown in FIG. 9A, a display panel DP-E may further include a partition wall member DMP-E. The partition wall member DMP-E may be adjacent to an organic layer 33-E and may be used to prevent an occupying area of the organic layer 33-E from being increased, when viewed in a plan view. For example, the partition wall member DMP-E may be used to control a position of the organic layer 33-E.

In an exemplary embodiment of the inventive concept, the partition wall member DMP-E may be disposed between the organic layer 33-E and a blocking groove BR-E, when viewed in a plan view. The partition wall member DMP-E may extend along an edge of the hole region PA. The partition wall member DMP-E may be covered with a charge control layer OL-E, a first inorganic layer 32-E, and a second inorganic layer 34-E.

The partition wall member DMP-E may include a first member DM1-E, a second member DM2-E, and a third member DM3-E. The first member DM1-E, the second member DM2-E, and the third member DM3-E may be sequentially stacked.

The first member DM1-E may be formed of or include the same material as a second insulating layer 22-E. The second member DM2-E may be formed of or include the same material as a third insulating layer 23-E. The third member DM3-E may be formed of or include the same material as a fourth insulating layer 31-E. In an exemplary embodiment of the inventive concept, each of the first member DM1-E, the second member DM2-E, and the third member DM3-E may be formed by the same process as that for forming a corresponding insulating layer, in which the same material is included.

In an exemplary embodiment of the inventive concept, the partition wall member DMP-E is provided on a first insulating layer 21-E, but the inventive concept is not limited thereto. For example, in the case where the partition wall member DMP-E is provided on the second insulating layer 22-E, the first member DM1-E is omitted from the partition wall member DMP-E. Alternatively, in the case where the partition wall member DMP-E is provided on the third insulating layer 23-E, the first member DM1-E and the second member DM2-E may be omitted. Furthermore, the partition wall member DMP-E may have a single-layered structure or a double-layered structure, from which one of the first to third members DM1-E to DM3-E is omitted, and the inventive concept is not limited to a specific one of these embodiments.

The organic layer 33-E covering at least a portion of a display device layer 30-E may be formed by an inkjet process of forming a liquid organic material on a first inorganic layer 32-E. In this case, the partition wall member DMP-E may be used to delimit a boundary of a region for the liquid organic material and to prevent the liquid organic material from being overflown into an outer region beyond the partition wall member DMP-E.

As shown in FIG. 9B, a display panel DP-F may include a plurality of blocking grooves BR1-F and BR2-F. In an exemplary embodiment of the inventive concept, a partition wall member DMP-F may be provided between the plurality of the blocking grooves BR1-F and BR2-F.

In the present embodiment, the partition wall member DMP-F may be disposed on a portion 21-PF of a first insulating layer 21-F disposed between the blocking grooves BR1-F and BR2-F.

An organic layer 33-F may partially cover a thin-film device layer 20-F and a display device layer 30-F. In an exemplary embodiment of the inventive concept, the formation of the organic layer 33-F may include forming a liquid organic material on a base substrate 10-F using an inkjet process. In this case, the organic layer 33-F may also fill the first blocking groove BR1-F. Thus, the first blocking groove BR1-F may be filled with the organic layer 33-F, which covers the thin-film device layer 20-F and the display device layer 30-F, without an additional filling process. Accordingly, it is possible to reduce an overall process time, and moreover, since the first blocking groove BR1-F is filled with the organic layer 33-F, it is possible to realize a display panel with an increased impact-resistant strength.

A filling member FM-F including the same material as the organic layer 33-F may be provided in the second blocking groove BR2-F. A top surface FM-UF of the filling member FM-F may be covered with a second inorganic layer 34-F covering the organic layer 33-F.

As shown in FIG. 9C, a partition wall member DMP-G may be provided between a module hole MH-G and a first blocking groove BR1-G. In an exemplary embodiment of the inventive concept, the partition wall member DMP-G may be provided on a portion 21-PG of a first insulating layer 21-G, which is located between the module hole MH-G and the first blocking groove BR1-G. In an exemplary embodiment of the inventive concept, when an organic layer 33-G in a liquid state is formed using an inkjet process, the organic layer 33-G may be formed to partially cover a thin-film device layer 20-G and a display device layer 30-G and fill an internal space of each of a first blocking groove BR1-G and a second blocking groove BR2-G. In other words, since the organic layer 33-G filling the first and second blocking grooves BR1-G and BR2-G and covering the thin-film device layer 20-G and the display device layer 30-G is formed through a single process, it is possible to reduce an overall process time. In addition, since the first and second blocking grooves BR1-G and BR2-G are filled with the organic layer 33-G, it is possible to realize a display panel with an increased impact-resistant strength.

FIGS. 10A to 10G are sectional views illustrating a method of fabricating a display panel, according to an exemplary embodiment of the inventive concept. For concise description, an element previously described with reference to FIGS. 4A to 5B may be identified by the same reference number without repeating an overlapping description thereof. Hereinafter, a method of fabricating a display panel will be described with reference to FIGS. 10A to 10G.

Figure 10A:
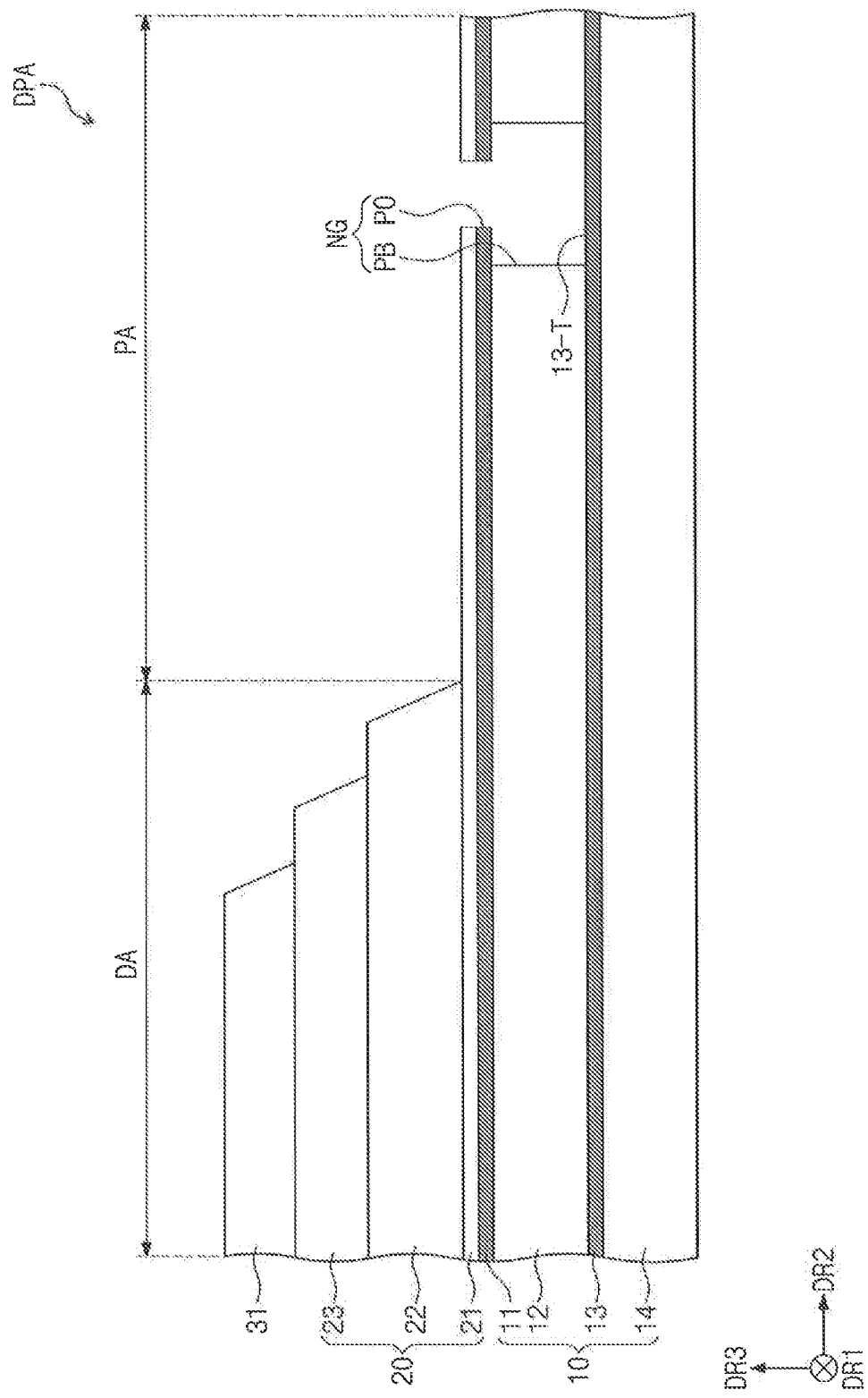
FIGS. 10A, 10B, 10C, 10D, 10E, 10F and 10G are sectional views illustrating a method of fabricating a display panel, according to an exemplary embodiment of the inventive concept.

As shown in FIG. 10A, a first preliminary substrate DPA with at least one blocking groove may be provided. The first preliminary substrate DPA may include the base substrate 10, the thin-film device layer 20, and the fourth insulating layer 31. The first preliminary substrate DPA may have substantially the same structure as the display panel DP of FIG. 4A; however, in FIG. 10A the charge control layer OL and other layers formed on the display panel DP are omitted. In other words, the first preliminary substrate DPA may include the first electrode E1 and the light emitting layer EL, which are formed on the display region DA as shown in FIG. 4A.

The blocking groove BR having an under-cut shape may be provided in the first preliminary substrate DPA. The blocking groove BR may be formed by an etching process or a laser process. In the case where the etching process is used, a difference in etch rate between the first barrier layer 11 and the first base layer 12 may be used to form the blocking groove BR with the under-cut shape. In the case where the laser process is used, a variation in reactivity caused by a wavelength of a laser light may be used to form the blocking groove BR with the under-cut shape. However, the inventive concept is not limited to this example. For example, any etching method of selectively removing an inorganic material and/or organic material may be used to form the blocking groove BR with the under-cut shape.

Figure 10B:
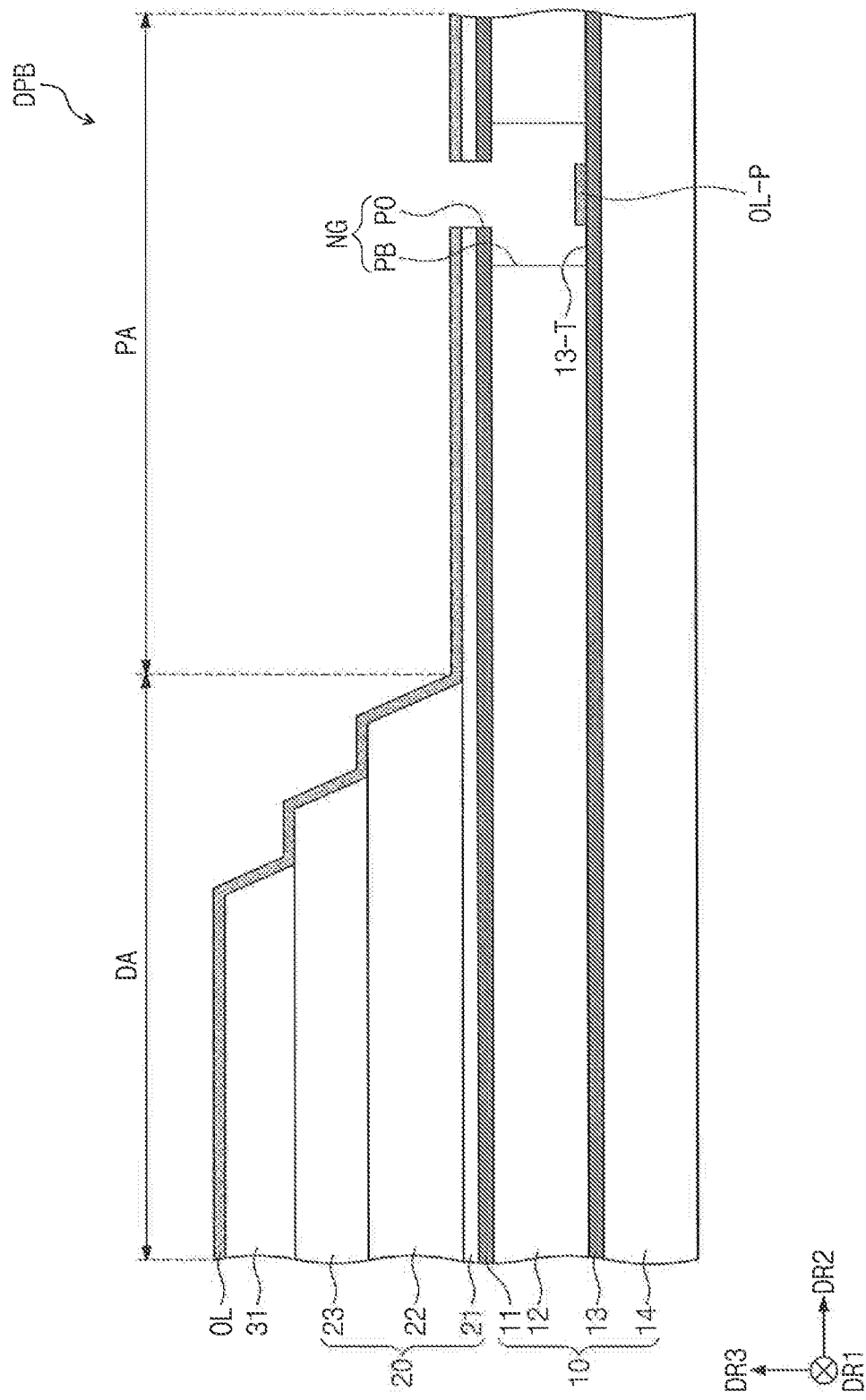

Thereafter, as shown in FIG. 10B, a second preliminary substrate DPB may be formed by forming the charge control layer OL constituting the organic light emitting device ED of FIG. 4A. The charge control layer OL may be formed by depositing an organic material. As shown in FIG. 10B, the charge control layer OL may be deposited on a portion of the exposed surface 13-T exposed through the opening PO. Thus, the additional pattern OL-P may be formed on a portion of a bottom surface of the patterned portion PB. The additional pattern OL-P of FIG. 10B may be formed by the same deposition process as that for the charge control layer OL, but the inventive concept is not limited thereto. For example, the additional pattern OL-P may be formed of or include the same material as at least one of the elements constituting the organic light emitting device ED.

The deposition of the organic material may be performed in an anisotropic manner. Hence, a portion of the organic material may be locally deposited on a specific region of the patterned portion PB exposed through the opening PO, thereby forming a localized pattern. In other words, the localized pattern may be spaced apart from the charge control layer OL. However, the inventive concept is not limited to this example, and in an exemplary embodiment of the inventive concept, the localized pattern may not be formed, depending on process conditions (e.g., time or deposition rate) for the deposition process.

Figure 10C:
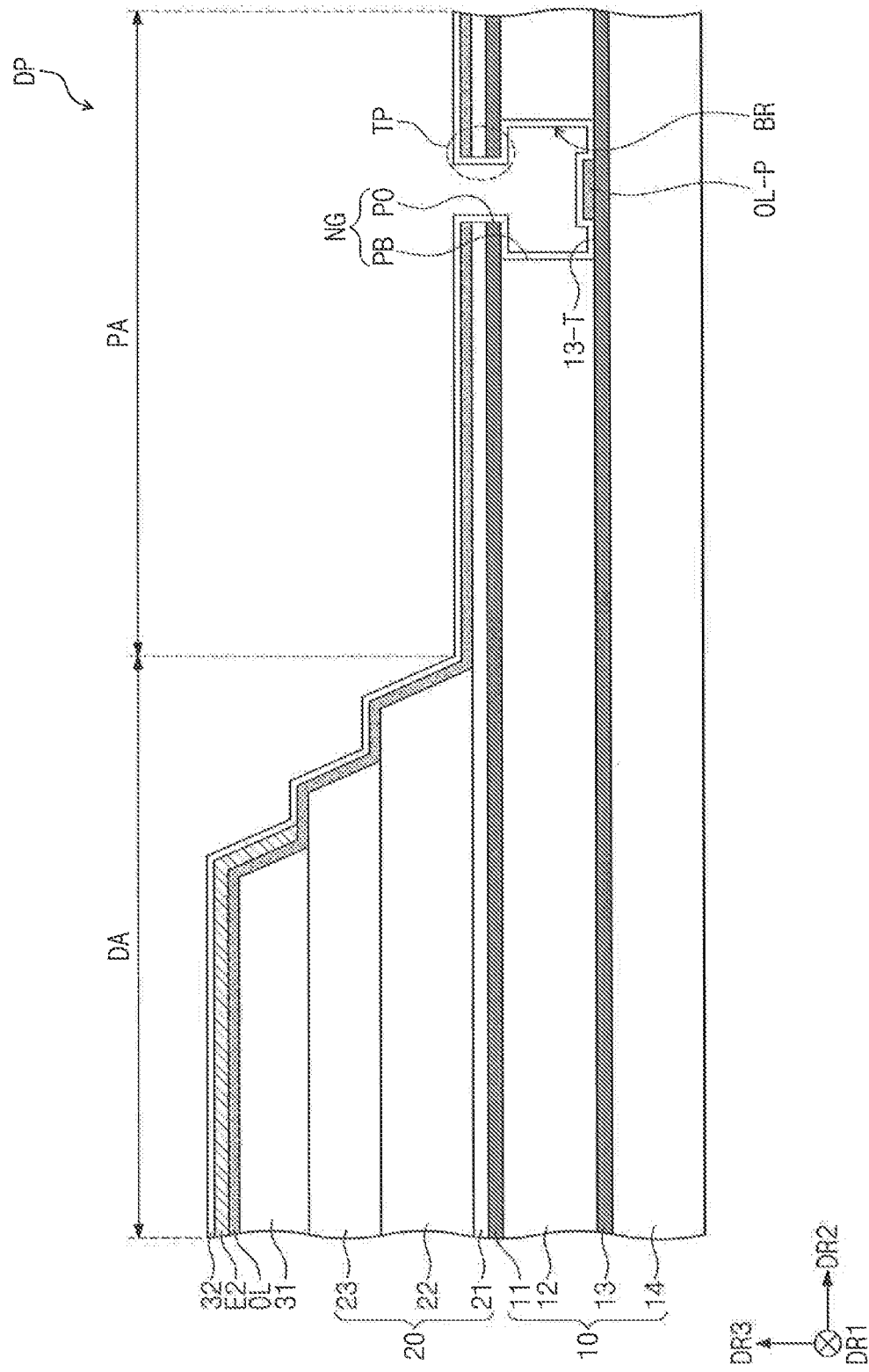

Next, as shown in FIG. 10C, the first inorganic layer 32 may be formed. In an exemplary embodiment of the inventive concept, a chemical vapor deposition may be used to form the first inorganic layer 32 on the entire top surface of the base substrate 10. The deposition of the first inorganic layer 32 may be performed in an isotropic manner. For example, the first inorganic layer 32 may be formed to conformally cover the inner surface of the internal space NG. Thus, an exposed surface of the first inorganic layer 32 may be used as an inner surface of the blocking groove BR. The first inorganic layer 32 may be formed to be in contact with the undercut regions of the blocking groove BR.

Figure 10D:
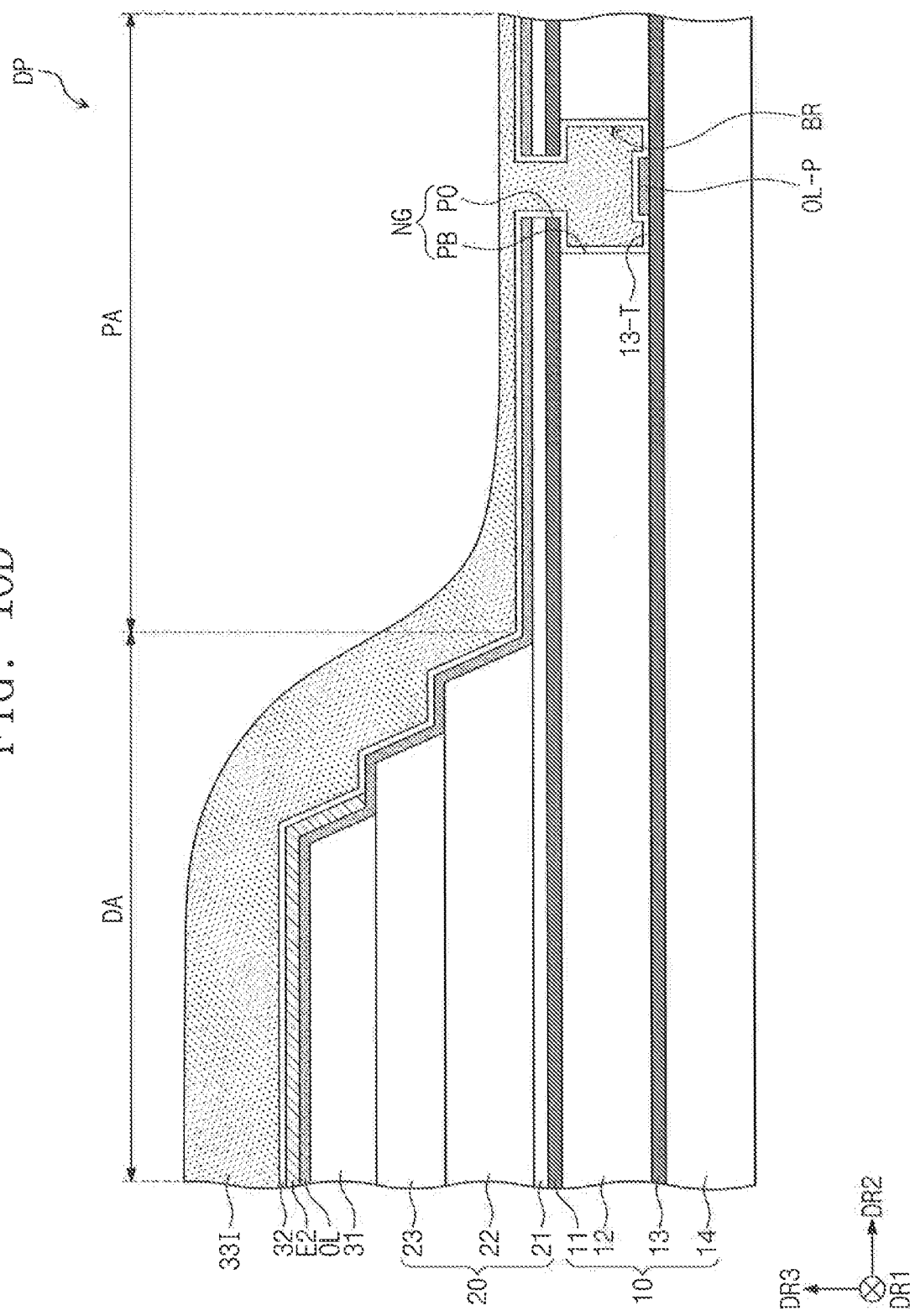

Thereafter, as shown in FIG. 10D, a preliminary organic layer 33I may be formed by providing an organic material to cover the front surface of the first inorganic layer 32. The preliminary organic layer 33I may be formed by an inkjet process. For example, a liquid organic material may be provided to form the preliminary organic layer 33I. The liquid organic material may be provided on a region of the display region DA, which is spaced apart from the hole region PA, and in this case, since the organic material is in a highly viscous liquid state, the organic material may fill the blocking groove BR.

Figure 10E:
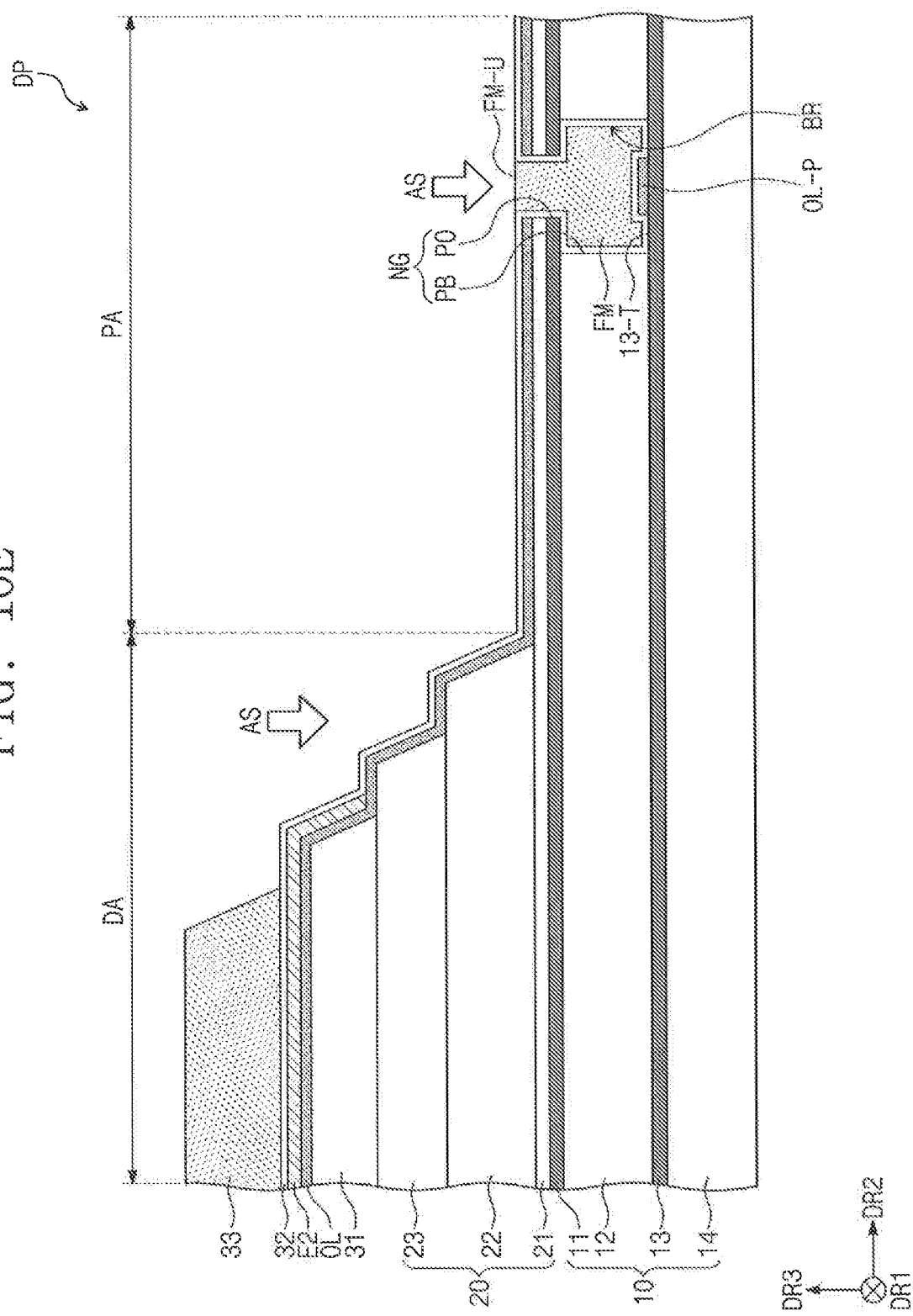
Figure 10F:
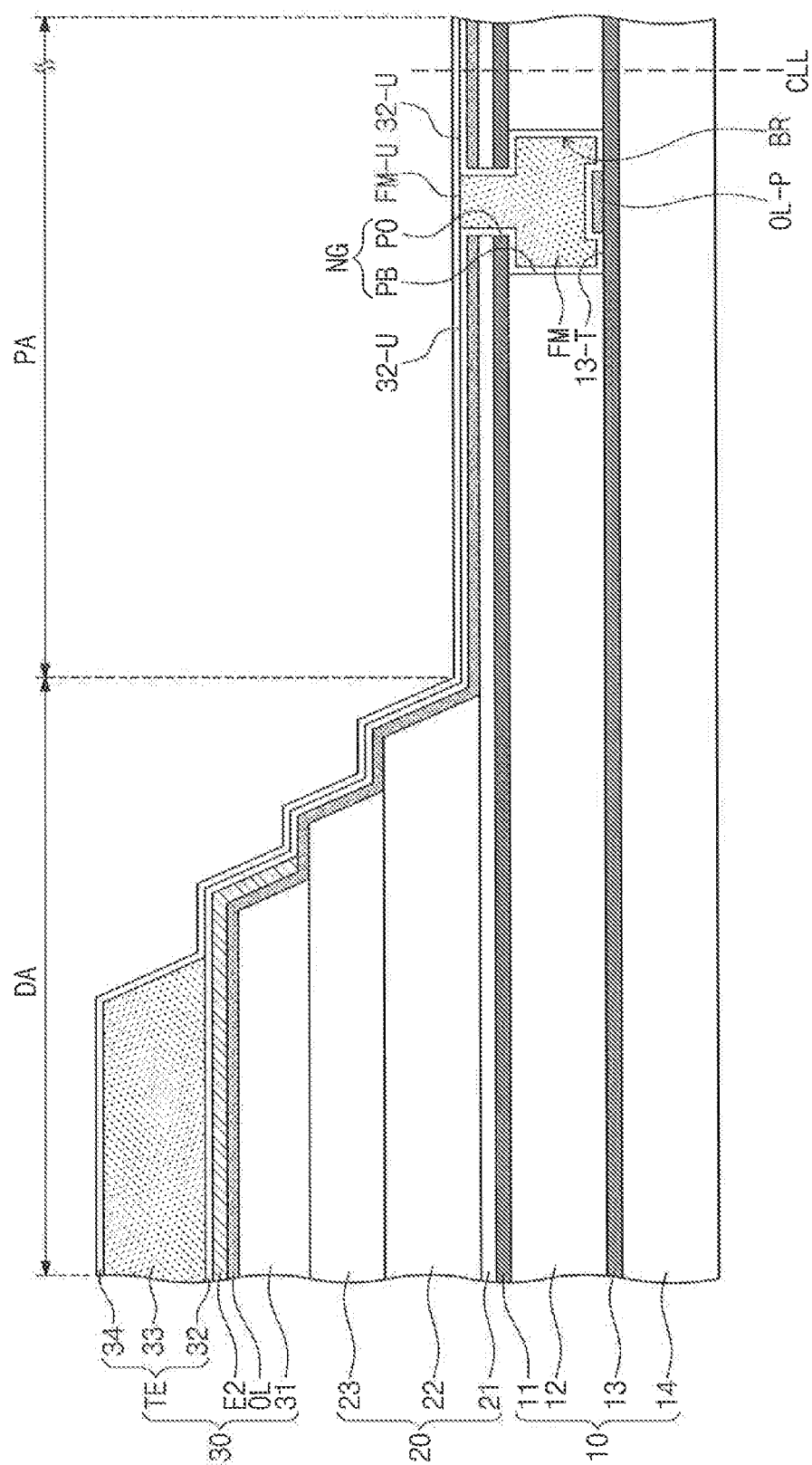
Figure 10G:
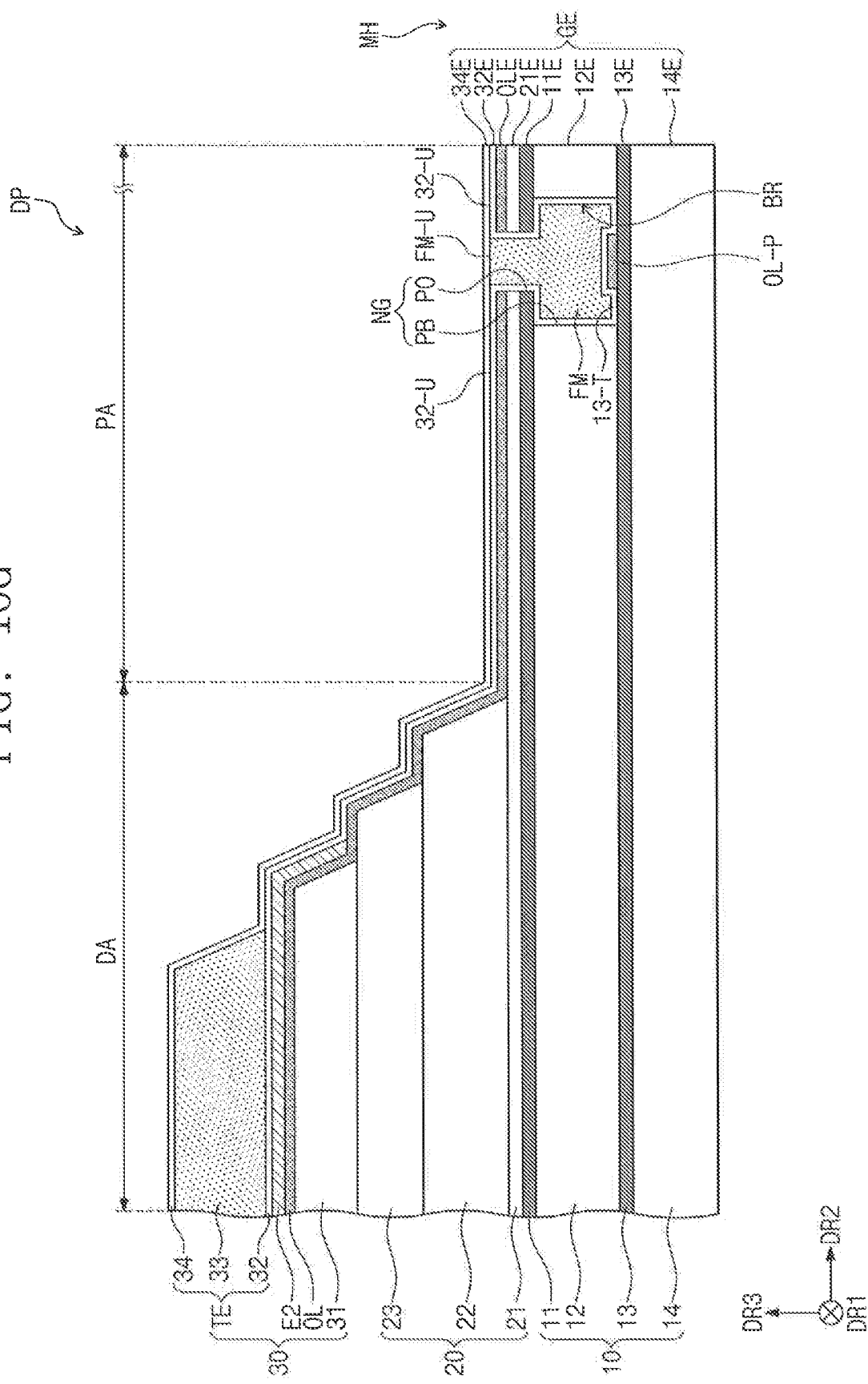

Next, as shown in FIG. 10E, a portion of the preliminary organic layer 33I may be removed to form the organic layer 33 and the filling member FM. The partial removal of the preliminary organic layer 33I may be performed using an ashing process. For example, a plasma ashing process may be used to remove the portion of the preliminary organic layer 33I. In FIG. 10E, the ashing process may be shown as "AS." In an exemplary embodiment of the inventive concept, the ashing process may be performed to remove other portions of the preliminary organic layer 33I, except for the organic layer 33 and the filling member FM. For example, other portions of the preliminary organic layer 33I, except for a portion filling the blocking groove BR, may be removed from the hole region PA. Thus, the preliminary organic layer 33I may not remain on a portion of the first inorganic layer 32 which is adjacent to the blocking groove BR of the hole region PA. After the ashing process, the remaining portion of the preliminary organic layer 33I on the display region DA may be used as the organic layer 33 constituting the encapsulation layer TE Thereafter, as shown in FIG. 10F, the second inorganic layer 34 including an inorganic material may be deposited on the base substrate 10. The second inorganic layer 34 may be formed on the front surface of the base substrate 10 by a chemical vapor deposition. For example, the second inorganic layer 34 may be formed on the front surface of the base substrate to cover the organic layer 33 and the filling member FM. The second inorganic layer 34 may be in contact with the top surface FM-U of the patterned portion PB. In addition, since, as described above, a portion of the preliminary organic layer 33I adjacent to the blocking groove BR is removed by the ashing process, the second inorganic layer 34 may be formed to be in contact with a top surface 32-U of the first inorganic layer 32 adjacent to the blocking groove BR. Accordingly, it is possible to prevent a moisture entering path from being formed in a region adjacent to the blocking groove BR. As shown in FIG. 10G, the module hole MH may be formed in a region the hole region PA. The module hole MH may be formed by the same process as that for one of the elements constituting the pixel layer PL (e.g., see FIG. 4A). Referring back to FIG. 5B, the module hole MH may have the inner surface GE defined by the ends 11E, 12E, 13E, and 14E of the base substrate 10, the end 21E of the first insulating layer 21, the end OLE of the charge control layer OL, the end 32E of the first inorganic layer 32, and the end 34E of the second inorganic layer 34, which are aligned to each other.

In a method of fabricating a display panel according to an exemplary embodiment of the inventive concept, the filling member FM supporting the blocking groove BR and the organic layer 33 constituting the encapsulation layer TE may be simultaneously formed by the same process, and thus, it is possible to increase process efficiency in a fabrication process. Furthermore, since the filling member FM is formed to fill or support a relatively weak under-cut shaped portion (e.g., the blocking groove BR), it is possible to realize a display panel with an increased impact-resistant strength. In addition, the first and second inorganic layers 32 and 34 adjacent to the module hole MH may be formed to be in contact with each other; thus, it is possible to more efficiently block a contamination material (e.g., moisture and/or oxygen), which may enter from the outside.

FIGS. 11A to 11E are sectional views illustrating a method of fabricating a display panel including a partition wall member, according to an exemplary embodiment of the inventive concept. For concise description, an element previously described with reference to FIGS. 10A to 10G may be identified by the same reference number without repeating an overlapping description thereof. Hereinafter, a method of fabricating a display panel including the partition wall member will be described with reference to FIGS. 11A to 11E. In FIGS. 11A to 11E, the reference numerals may be denoted with an "E". For example, in FIG. 11B, DMP-E may refer to a partition wall member.

Figure 11A:
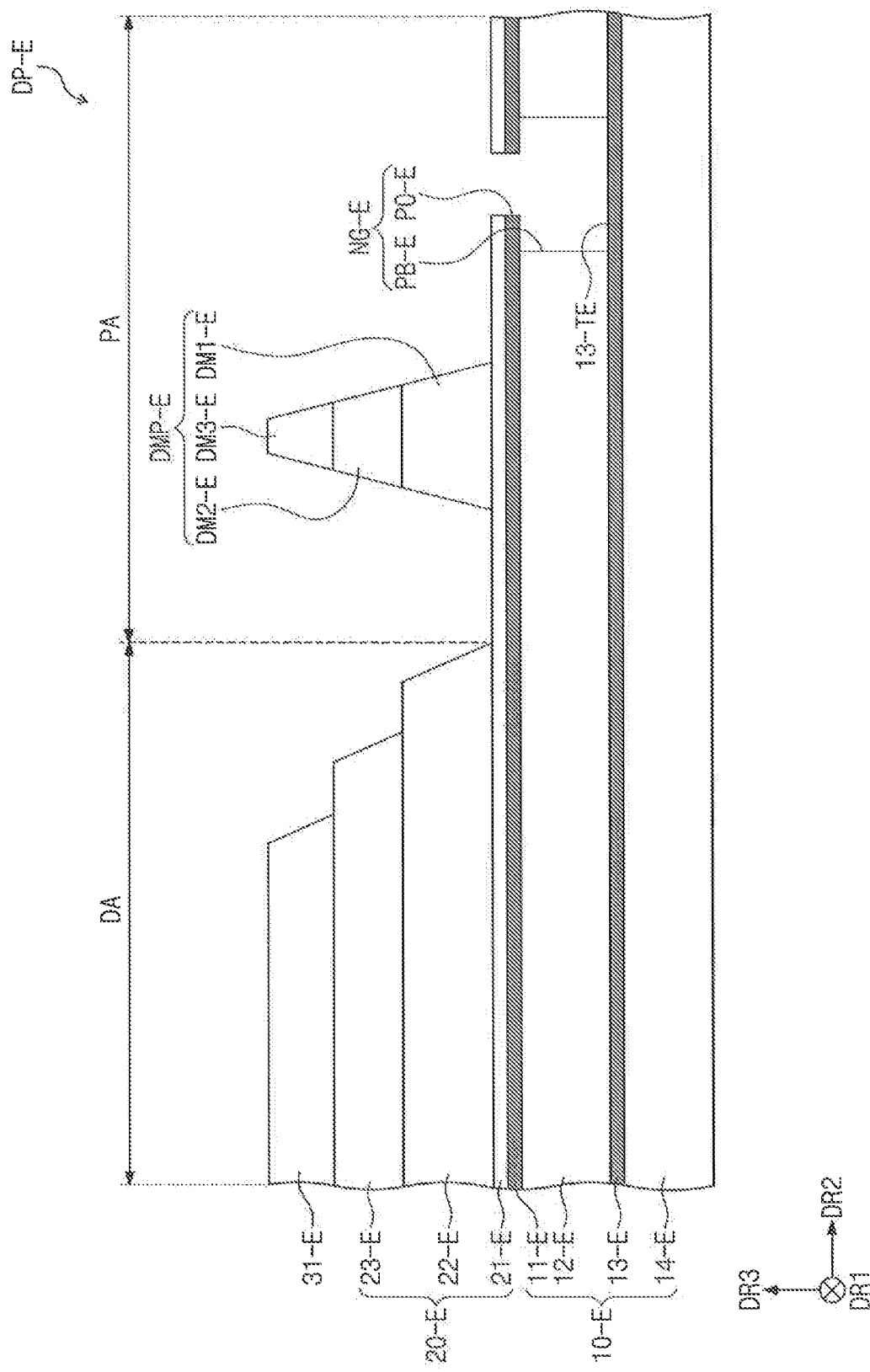
FIGS. 11A, 11B, 11C, 11D and 11E are sectional views illustrating a method of fabricating a display panel including a partition wall member, according to an exemplary embodiment of the inventive concept.

As shown in FIG. 11A, a partition wall member DMP-E may be formed on a base substrate 10-E. The partition wall member DMP-E may be a multi-layered structure including the same materials as at least one of insulating layers constituting a pixel layer. In FIG. 11A, the partition wall member DMP-E is illustrated to include the first, second, and third members DM1-E, DM2-E, and DM3-E, which include the same materials as the second, third, and fourth insulating layers 22-E, 23-E, and 31-E, respectively, and are sequentially stacked, but the inventive concept is not limited thereto. For example, at least one of the first, second, and third members DM1-E, DM2-E, and DM3-E may be omitted, and moreover, the partition wall member DMP-E may be formed to have a single-layered structure.

The partition wall member DMP-E may be formed between the second, third and fourth insulating layers 22-E, 23-E, and 31-E and the blocking groove BR-E. FIG. 11A illustrates an example in which the partition wall member DMP-E is provided on the first insulating layer 21-E, but the inventive concept is not limited thereto. For example, the partition wall member DMP-E may be directly provided on another insulating layer, except for the first insulating layer 21-E, or on the base substrate 10-E.

Figure 11B:
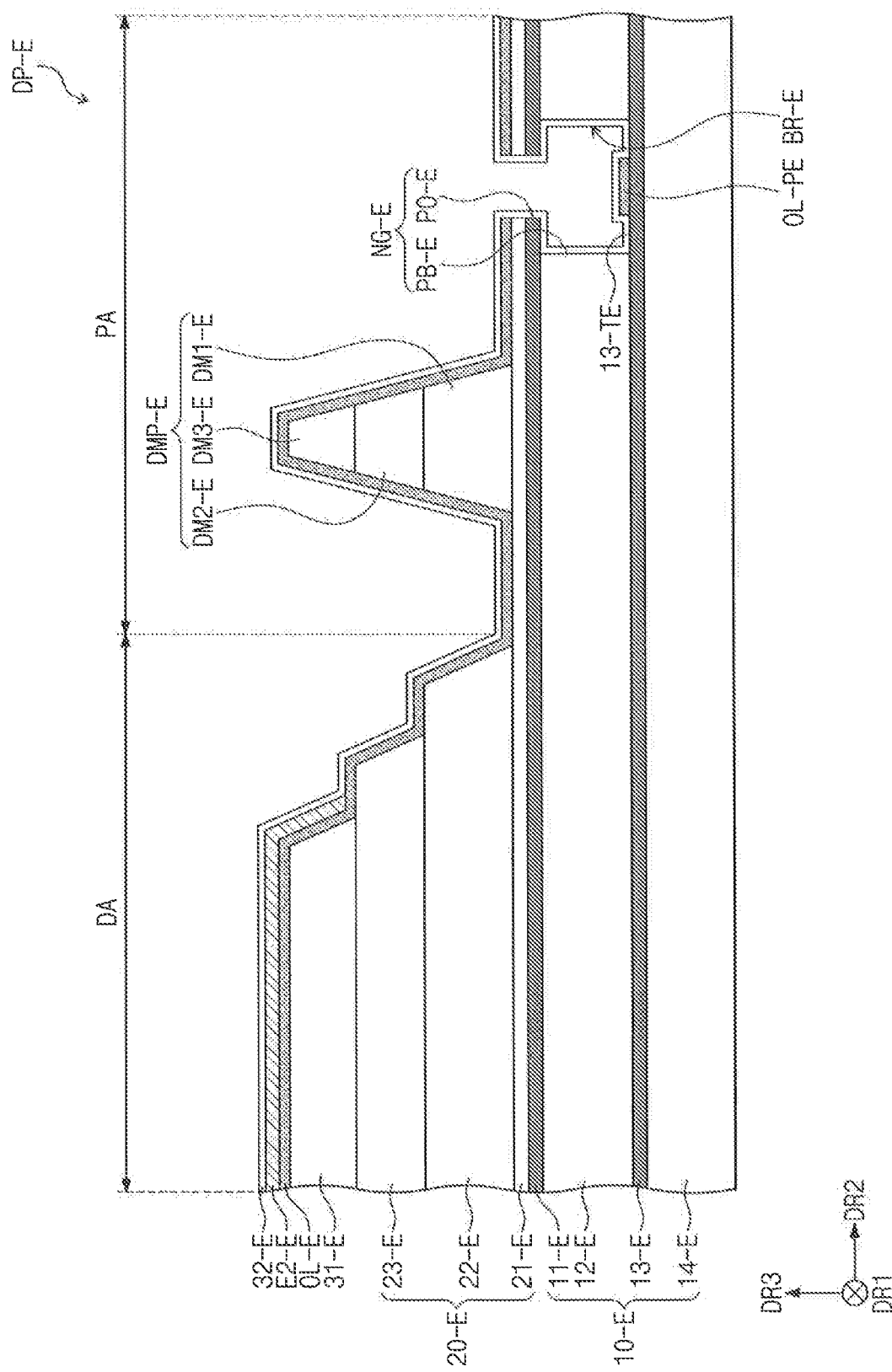

Thereafter, as shown in FIG. 11B, the charge control layer OL-E may be deposited on the base substrate 10-E. The charge control layer OL-E may be deposited to cover the partition wall member DMP-E. Next, the first inorganic layer 32-E may be deposited on a front surface of the charge control layer OL-E. In an exemplary embodiment of the inventive concept, the charge control layer OL-E and the first inorganic layer 32-E may be deposited using substantially the same methods as those described with reference to FIGS. 10B and 10C.

Figure 11C:
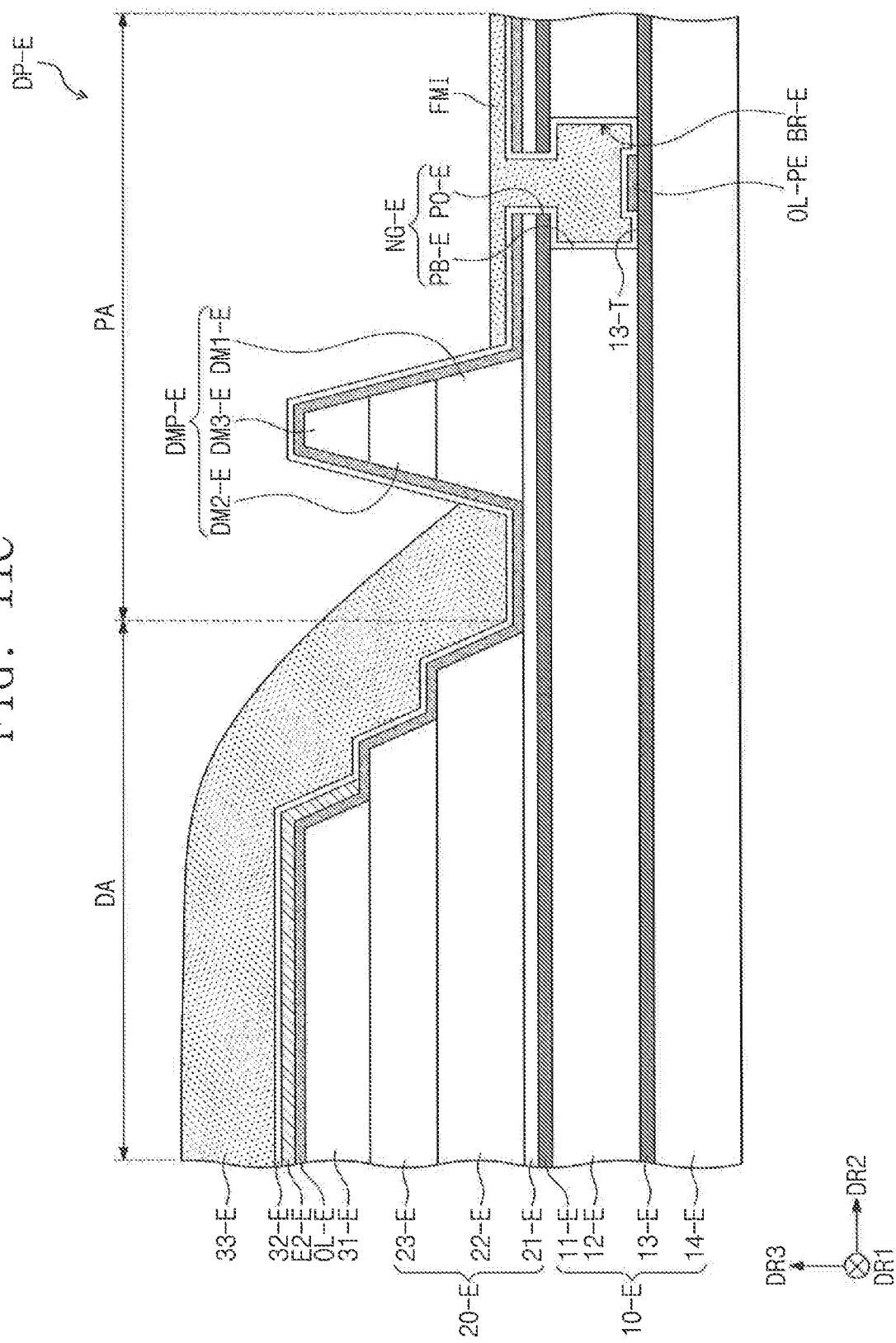

Next, as shown in FIG. 11C, the organic layer 33-E may be formed on the display region DA. The organic layer 33-E may be formed by a printing process (e.g., an inkjet process) or by a deposition process. The organic layer 33-E may be supplied in the form of a liquid material, and in this case, the partition wall member DMP-E may prevent the organic layer 33-E from being overflown toward the blocking groove BR-E.

Thereafter, a preliminary filling member FM1 including an organic material may be provided on the blocking groove BR-E or a region adjacent to the blocking groove BR-E. The preliminary filling member FM1 may be formed on a region of the first inorganic layer 32-E, which is located adjacent to the blocking groove BR-E, with the partition wall member DMP-E interposed therebetween. The preliminary filling member FM1 may be formed by a printing process (e.g., an inkjet process) or a deposition process.

Figure 11D:
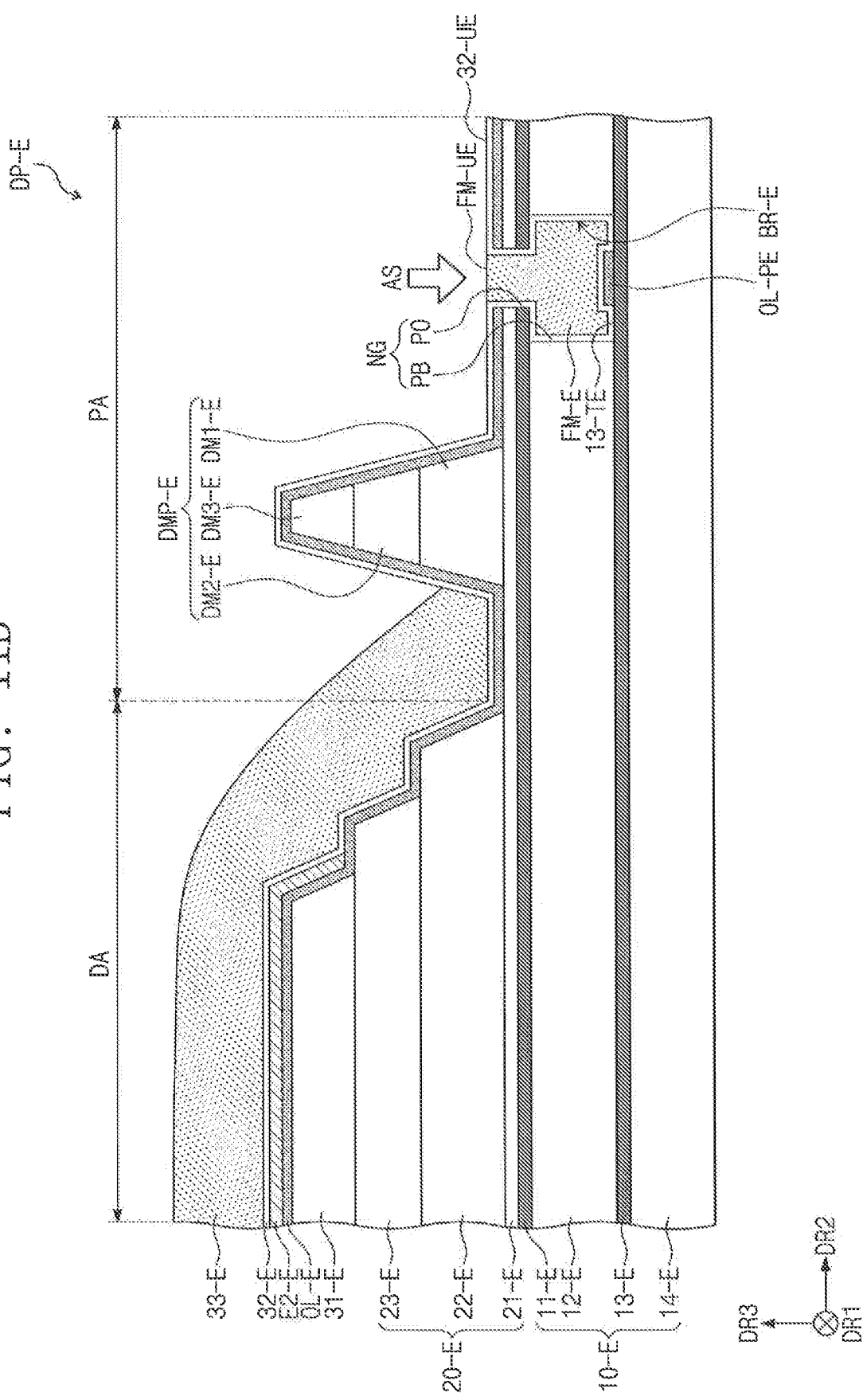

Next, as shown in FIG. 11D, a portion of the preliminary filling member FM1 may be removed to form a filling member FM-E filling the blocking groove BR-E. As a result of the partial removal of the preliminary filling member FM1, a top surface FM-UE of the filling member FM-E and a top surface 32-UE of the first inorganic layer 32-E adjacent to the top surface FM-UE may be exposed to the outside.

Figure 11E:
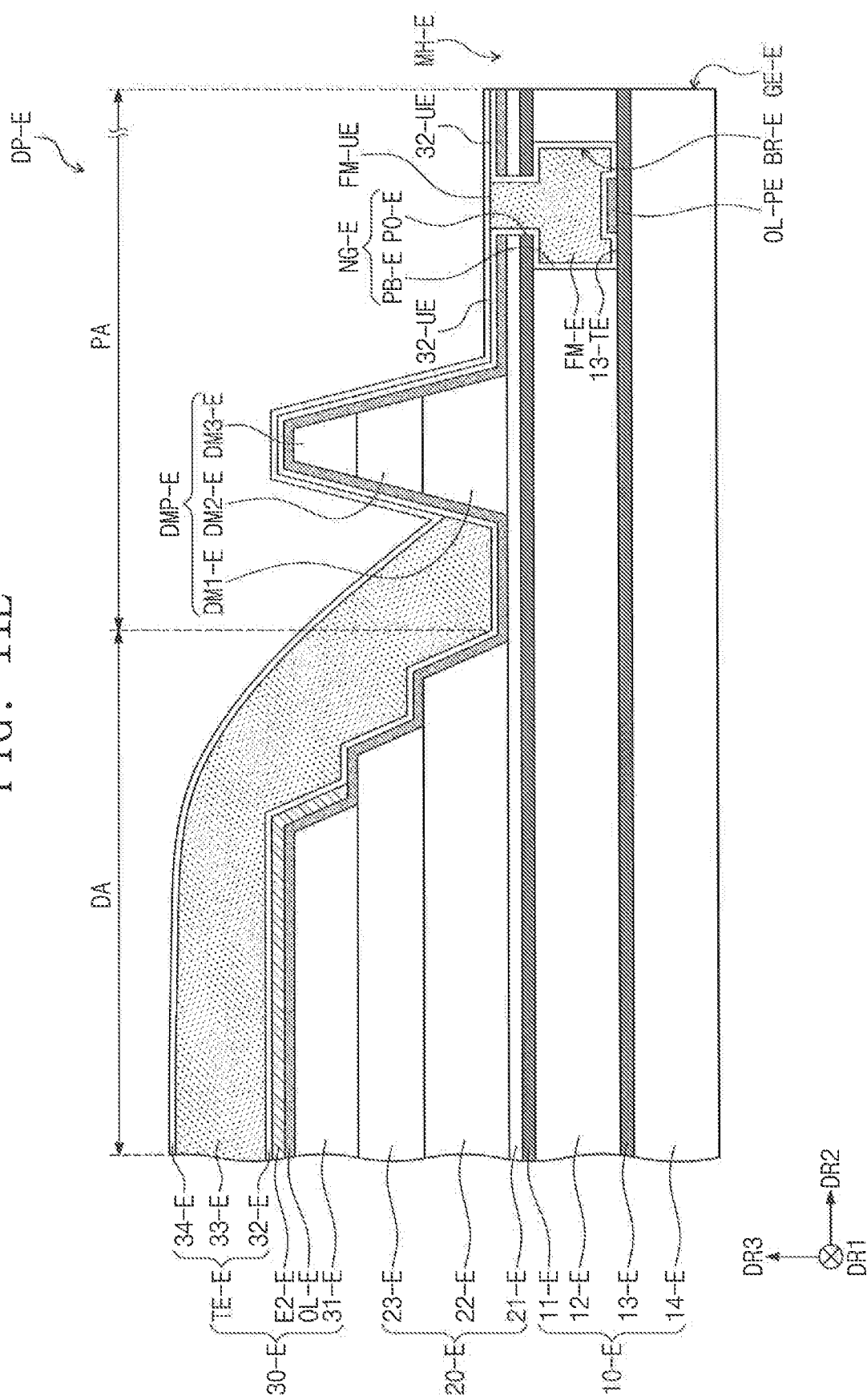

Thereafter, as shown in FIG. 11E, a second inorganic layer 34-E including an inorganic material may be deposited on the base substrate 10-E. The second inorganic layer 34-E may be deposited to cover the organic layer 33-E, the exposed top surface FM-UE of the filling member FM-E, and the exposed top surface 32-UE of the first inorganic layer 32-E adjacent to the top surface FM-UE.

In a method of fabricating a display panel according to an exemplary embodiment of the inventive concept, unlike the method described with reference to FIGS. 10D and 10G, the partition wall member DMP-E may be used to delimit a boundary of a region, on which a liquid organic material for the organic layer 33-E will be provided, when the organic layer 33-E is deposited on the display region DA. Thus, the organic layer 33-E constituting the encapsulation layer TE (e.g., see FIG. 4A) may be formed by a single process, and it is possible to omit an additional ashing process.

According to an exemplary embodiment of the inventive concept, an electronic module and a display panel are provided to have no interference therebetween. Thus, even when an electronic module is provided in a display device, it is possible to realize a display device with a narrow bezel region. In addition, it is possible to prevent a device from being damaged by a contamination material (e.g., moisture and/or oxygen) supplied from the outside. Accordingly, a display device with increased process and operational reliability may be provided.

In addition, according to an exemplary embodiment of the inventive concept, a filling member is provided in a blocking groove, and this makes it possible to realize a highly reliable display device.

While the inventive concept has been particularly shown and described with reference to exemplary embodiments thereof, it will be understood by one of ordinary skill in the art that variations in form and detail may be made thereto without departing from the spirit and scope of the inventive concept as defined by the attached claims.

What is claimed is:

1. A display panel, comprising:
   a display region, a hole region at least partially surrounded by the display region, and an intermediate region disposed between the display region and the hole region and the display panel comprising:
   a module hole in the hole region and passing through the display panel;
   a first groove in the intermediate region and surrounding the module hole;
   a second groove in the intermediate region and disposed between the first groove and module hole;
   a light emitting element in the display region;
   an encapsulation layer including a first inorganic layer covering the light emitting element, a second inorganic layer, and an organic layer disposed between the first inorganic layer and the second inorganic layer;
   a dam portion in the intermediate region and surrounding the module hole; and
   an organic pattern disposed in the first groove and the second groove, and
   wherein a portion of the organic layer is disposed in the first groove.

2. The display panel of claim 1, wherein the first inorganic layer is disposed in the first groove and covered by the portion of the organic layer.

3. The display panel of claim 1, further comprising a filling member disposed in the second groove.

4. The display panel of claim 3, wherein the filling member has a same material as the organic layer.

5. The display panel of claim 1, further comprising a plurality of insulating layers disposed on the display region, and
   wherein the dam portion has a same material as at least one of the plurality of insulating layers.

6. The display panel of claim 1, wherein the light emitting element further comprises a first electrode, a second electrode, a light emitting layer, and a charge control layer disposed between the first electrode and the second electrode, and
   wherein the organic pattern has a same material as the charge control layer or the light emitting layer.

7. The display panel of claim 1, wherein the first inorganic layer covers the organic pattern in the first groove and the second groove.

8. The display panel of claim 1, wherein the display panel comprises a base layer including a first organic material and a barrier layer including a first inorganic material and dispsed on the base layer, and
   each of the first groove and the second groove comprises a base groove in which a portion of the base layer is recessed, and a substrate opening penetrating the barrier layer and overlapping the base groove.

9. The display panel of claim 8, wherein the display panel further comprises at least one insulating layer including an inorganic material and disposed on the barrier layer, and
wherein the insulating layer comprises a insulating groove overlapping the substrate opening.

10. The display panel of claim 9, further comprising a transistor comprising a semiconductor layer and connecting the light emitting element, and
wherein the insulation layer covers the semiconductor layer.

11. The display panel of claim 8, wherein the display panel comprises a sub base layer including a second organic material disposed under the base layer and a sub barrier layer disposed between the base layer and sub base layer and including a second inorganic material, and
wherein the base groove exposes the sub barrier layer.

12. The display panel of claim 1, wherein at least one of the first groove and the second groove has a circular, an oval, or a polygonal closed line shape on a plane.

13. The display panel of claim 12, wherein the module hole has a circular, an oval, or a polygonal shape on a plane.

14. The display panel of claim 1, wherein the dam portion is disposed between the first groove and the second groove.

15. The display panel of claim 11, wherein the dam portion is disposed between the second groove and the module hole.

16. A display panel, comprising:
a display region, a hole region at least partially surrounded by the display region, and an intermediate region disposed between the display region and the hole region and the display panel comprising:
a module hole in the hole region and passing through the display panel;
a first groove in the intermediate region and surrounding the module hole;
a second groove in the intermediate region and disposed between the first groove and module hole;
a light emitting element in the display region;
an encapsulation layer including a first inorganic layer covering the light emitting element, a second inorganic layer, and an organic layer disposed between the first inorganic layer and the second inorganic layer; and
a dam portion in the intermediate region and surrounding the module hole and disposed between the first groove and the second groove,
wherein a portion of the organic layer is disposed in the first groove.

17. The display panel of claim 16, further comprising an organic pattern disposed in the first groove and the second groove.

18. The display panel of claim 17, wherein the light emitting element further comprises a first electrode, a second electrode, a light emitting layer, and a charge control layer disposed between the first electrode and the second electrode, and
wherein the organic pattern has a same material as the charge control layer or the light emitting layer.

19. The display panel of claim 16, further comprising a plurality of insulating layers disposed on the display region, and wherein the dam portion has a same material as at least one of the plurality of insulating layers.

20. The display panel of claim 19, wherein the first inorganic layer and the second inorganic layer contact each other from the dam portion to the module hole.

21. An electronic device, comprising:
a display panel comprising a display region, a hole region at least partially surrounded by the display region and defined by a module hole which penetrates the display panel, and an intermediate region disposed between the display region and the hole region; and
a camera module overlapping the module hole,
wherein the display panel comprises;
a first groove in the intermediate region and surrounding the module hole;
a second groove in the intermediate region and disposed between the first groove and module hole;
a light emitting element in the display region;
an encapsulation layer including a first inorganic layer covering the light emitting element, a second inorganic layer, and an organic layer disposed between the first inorganic layer and the second inorganic layer;
a dam portion in the intermediate region and surrounding the module hole; and
an organic pattern disposed in the first groove and the second groove, and
wherein a portion of the organic layer is disposed in the first groove.

22. The electronic device of claim 21, wherein the first inorganic layer is disposed in the first groove and covered by the portion of the organic layer.

23. The electronic device of claim 21, further comprising a filling member disposed in the second groove.

24. The electronic device of claim 23, wherein the filling member has a same material as the organic layer.

25. The electronic device of claim 21, further comprising a plurality of insulating layers disposed on the display region, and
wherein the dam portion has a same material as at least one of the plurality of insulating layers.

26. The electronic device of claim 21, wherein the light emitting element further comprises a first electrode, a second electrode, a light emitting layer, and a charge control layer disposed between the first electrode and the second electrode, and
wherein the organic pattern has a same material as the charge control layer or the light emitting layer.

27. The electronic device of claim 21, wherein the first inorganic layer covers the organic pattern in the first groove and the second groove.

28. The electronic device of claim 21, wherein at least one of the first groove and the second groove bas a circular, an oval, or a polygonal closed line shape on a plane.

29. The electronic device of claim 21, wherein the dam portion is disposed between the first groove and the second groove.

30. The electronic device of claim 21, further comprising a sensing unit directly disposed on the encapsulation layer, and
wherein the module hole penetrates the display panel and the sensing unit.

* * * * *